US012812914B2

(12) United States Patent
Jo et al.

(10) Patent No.: US 12,812,914 B2
(45) Date of Patent: Nov. 24, 2026

(54) DISPLAY PANEL AND METHOD OF MANUFACTURING THE SAME

(71) Applicant: Samsung Display Co., Ltd., Yongin-si (KR)

(72) Inventors: Jungyun Jo, Yongin-si (KR); Sukyoung Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 491 days.

(21) Appl. No.: 18/454,609

(22) Filed: Aug. 23, 2023

(65) Prior Publication Data

US 2024/0162326 A1 May 16, 2024

(30) Foreign Application Priority Data

Nov. 11, 2022 (KR) ........................ 10-2022-0150620

(51) Int. Cl.
*H10D 30/67* (2025.01)
*H10D 30/01* (2025.01)
(Continued)

(52) U.S. Cl.
CPC ..... *H10D 30/6739* (2025.01); *H10D 30/0314* (2025.01); *H10D 30/0321* (2025.01); *H10D 64/01* (2025.01); *H10K 59/126* (2023.02)

(58) Field of Classification Search
CPC ........... H10D 30/0314; H10D 30/0321; H10D 30/6739; H10D 30/6745; H10D 64/01;
(Continued)

(56) References Cited

U.S. PATENT DOCUMENTS 5,909,635 A * 6/1999 Marieb ............. H01L 21/76886 257/E21.589
11,189,681 B2 11/2021 Ko et al.
(Continued)

FOREIGN PATENT DOCUMENTS

KR 10-2005-0045730 A 5/2005
KR 10-2020-0027135 A 3/2020
KR 10-2021-0094188 A 7/2021

OTHER PUBLICATIONS

Liu, Z.W., et al., "A Developed Method for Fabricating In-Situ $TiC_p$/Mg Composites by Using Quick Preheating Treatment and Ultrasonic Vibration," Metallurgical and Materials Transactions A, vol. 43A, Jun. 2012, pp. 2116-2124.

*Primary Examiner* — Britt Hanley
*Assistant Examiner* — Kevin Quinto
(74) *Attorney, Agent, or Firm* — Womble Bond Dickinson (US) LLP

(57) ABSTRACT

A display panel includes: a base substrate; a light emitting element on the base substrate; a transistor between the base substrate and the light emitting element, and connected with the light emitting element; and a conductive pattern between the base substrate and the light emitting element. The conductive pattern includes: a first conductive layer including a first material; a second conductive layer on the first conductive layer, and including a second material different from the first material; a blocking layer between the first conductive layer and the second conductive layer, and including a third material different from the first material; and an intermediate layer between the blocking layer and the second conductive layer, and contacting the second conductive layer. The intermediate layer includes an alloy of the first material and the second material.

21 Claims, 16 Drawing Sheets

(51) Int. Cl.
*H10D 64/01* (2025.01)
*H10K 59/126* (2023.01)

(58) Field of Classification Search
CPC .. H10D 86/0223; H10D 86/441; H10D 86/60; H10K 59/1201; H10K 59/1213; H10K 59/123; H10K 59/126; H10K 59/131; H10K 71/00
See application file for complete search history.

(56) References Cited

U.S. PATENT DOCUMENTS

| | | | | |
|---|---|---|---|---|
| 11,706,944 | B2 | 7/2023 | Baek et al. | |
| 2002/0021293 | A1* | 2/2002 | Tam | G09G 3/325 345/204 |
| 2005/0099369 | A1* | 5/2005 | Lee | H10K 59/1315 257/E27.111 |
| 2011/0220896 | A1* | 9/2011 | Miyakawa | H10D 30/0316 257/E29.294 |
| 2017/0194294 | A1* | 7/2017 | Yanagida | H01L 23/49541 |

* cited by examiner

DISPLAY PANEL AND METHOD OF MANUFACTURING THE SAME

CROSS-REFERENCE TO RELATED APPLICATIONS

This application claims priority to and the benefit of Korean Patent Application No. 10-2022-0150620, filed on Nov. 11, 2022, the entire content of which is incorporated by reference herein.

BACKGROUND

Aspects of embodiments of the present disclosure relate to a display panel, and more particularly, to a display panel including low resistance lines, and a method of manufacturing the same.

A display panel includes pixels for displaying an image. The pixel may include a display element, and signal lines or a driving element. The display element may include an emissive element or a reflective element. The driving element may include transistors and capacitors. The signal lines electrically connect the driving element, the display element, and other pixels to one another. The signal lines may transfer various electrical signals, and the display element and the driving element may be driven by the electrical signals provided from the signal lines.

The above information disclosed in this Background section is for enhancement of understanding of the background of the present disclosure, and therefore, it may contain information that does not constitute prior art.

SUMMARY

One or more embodiments of the present disclosure are directed to a display panel including low resistance lines, and a method of manufacturing the same.

According to one or more embodiments of the present disclosure, a display panel includes: a base substrate; a light emitting element on the base substrate; a transistor between the base substrate and the light emitting element, and connected with the light emitting element; and a conductive pattern between the base substrate and the light emitting element. The conductive pattern includes: a first conductive layer including a first material; a second conductive layer on the first conductive layer, and including a second material different from the first material; a blocking layer between the first conductive layer and the second conductive layer, and including a third material different from the first material; and an intermediate layer between the blocking layer and the second conductive layer, and contacting the second conductive layer. The intermediate layer includes an alloy of the first material and the second material.

In an embodiment, the first material may have a lower resistance than that of the second material.

In an embodiment, the third material may include a nitride of the second material.

In an embodiment, the second material may include titanium.

In an embodiment, the first material may include aluminum.

In an embodiment, the intermediate layer may contact the blocking layer.

In an embodiment, the intermediate layer may have a smaller thickness than that of the first conductive layer.

In an embodiment, the display panel may further include a shielding layer on the second conductive layer.

In an embodiment, the shielding layer may have a lower light transmittance than that of the second conductive layer.

In an embodiment, the shielding layer may include amorphous carbon.

In an embodiment, the transistor may include low-temperature polysilicon.

In an embodiment, the conductive pattern may be a gate of the transistor, or a signal line located at a same layer as that of the gate.

According to one or more embodiments of the present disclosure, a display panel manufacturing method includes: providing a semiconductor pattern including amorphous silicon; providing a first conductive pattern including a first layer, a second layer, a third layer, and a fourth layer that are sequentially stacked; performing a first heat treatment; providing an additional layer on the first conductive pattern; and performing a second heat treatment for crystallizing the semiconductor pattern. In the performing of the first heat treatment, the fourth layer diffuses into the third layer to form an intermediate layer, and the intermediate layer includes an alloy of a material of the fourth layer and a material of the third layer.

In an embodiment, the performing of the first heat treatment may continue at a temperature of 600 degrees or lower.

In an embodiment, the intermediate layer may include an alloy of aluminum and titanium.

In an embodiment, the second layer may include titanium nitride.

In an embodiment, the performing of the second heat treatment may continue at a temperature of 600 degrees or lower.

In an embodiment, the first conductive pattern may further include a fifth layer on the fourth layer, and the fifth layer may have a higher light transmittance than that of the fourth layer.

In an embodiment, the fifth layer may have a lower light transmittance than that of the fourth layer after the performing of the first heat treatment.

In an embodiment, the fifth layer may include amorphous carbon.

In an embodiment, the method may further include forming at least one contact hole in the additional layer by an etching gas, and the etching gas may include fluorine.

BRIEF DESCRIPTION OF THE FIGURES

The above and other aspects and features of the present disclosure will be more clearly understood from the following detailed description of the illustrative, non-limiting embodiments with reference to the accompanying drawings, in which.

DETAILED DESCRIPTION

Figure 1:
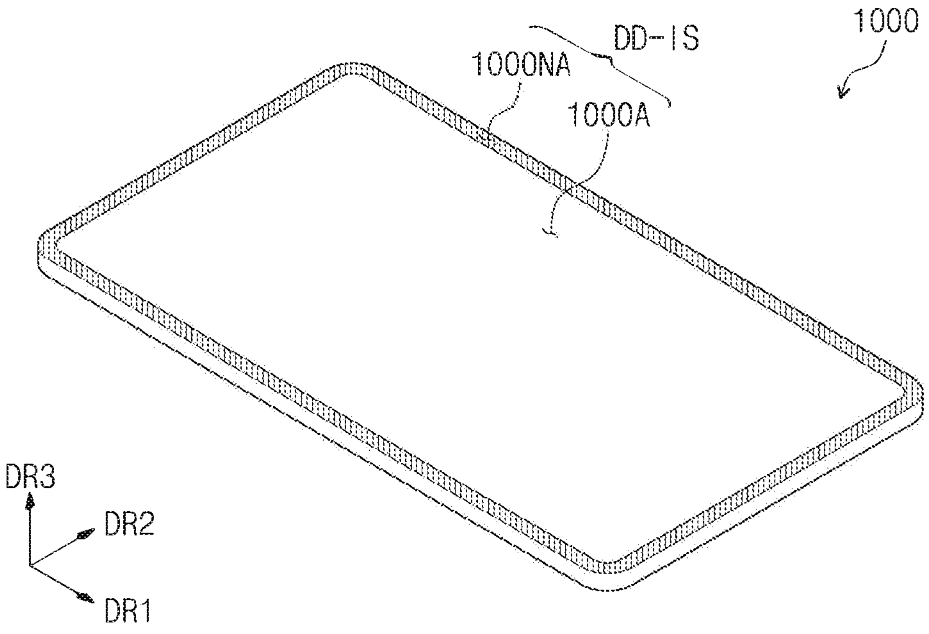
FIG. 1 is a perspective view of a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display device according to an embodiment of the present disclosure.

Referring to FIG. 1, the display device 1000 may be a device that is activated according to an electrical signal. For example, the display device 1000 may be a mobile phone, a tablet, a vehicle navigator, a game player, a wearable device, or a monitor, but the present disclosure is not particularly limited thereto.

The display device 1000 may display an image through a display surface DD-IS. The display DD-IS is parallel to or substantially parallel to a surface defined by a first direction DR1 and a second direction DR2. The top surface of a member disposed at (e.g., in or on) the uppermost side of the display device 1000 may be defined as the display surface DD-IS. The normal direction of the display surface DD-IS, or in other words, the thickness direction of the display device 1000, is indicated by a third direction DR3. The front surfaces (e.g., top surfaces) and the rear surfaces (e.g., bottom surfaces) of the layers or units to be described in more detail below are distinguished from each other by the third direction DR3.

A display area 1000A and a non-display area 1000NA may be defined in the display device 1000. The non-display area 1000NA may be a peripheral area of the display area 1000A. The display device 1000 may display an image through the display area 1000A. The non-display area 1000NA may surround (e.g., around a periphery of) the display area 1000A. In an embodiment of the present disclosure, the non-display area 1000NA may be omitted as needed or desired, or may be disposed in (e.g., only in) one side of the display area 1000A. FIG. 1 illustrates an example of a planar display device 1000, but the present disclosure is not limited thereto, and the display device 1000 may have a curved shape.

Figure 2:
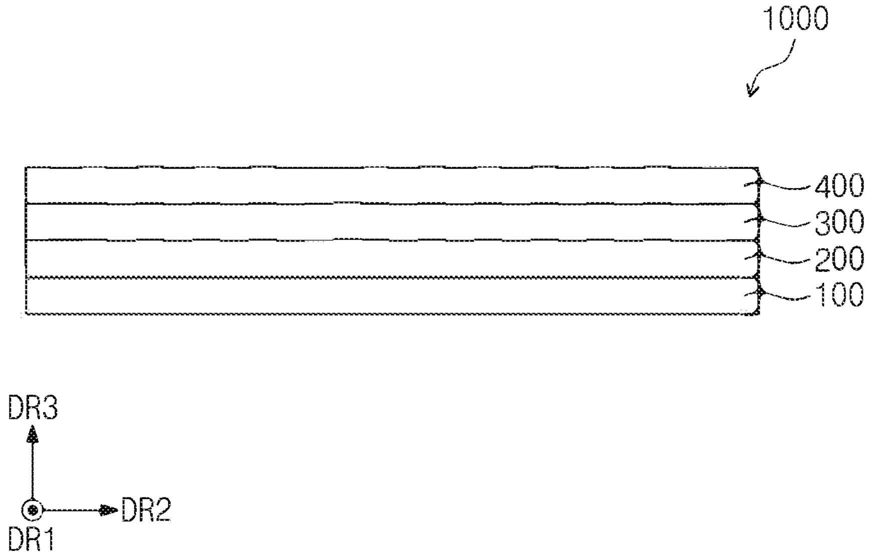
FIG. 2 is a schematic cross-sectional view of a display device according to an embodiment of the present disclosure.

FIG. 2 is a schematic cross-sectional view of a display device according to an embodiment of the present disclosure.

Referring to FIG. 2, the display device 1000 may include a display panel 100, a sensor layer 200, an optical film 300, and a window 400. In an embodiment of the present disclosure, some of the aforementioned components may be omitted as needed or desired, or other components may be further added as needed or desired. An adhesive layer may be disposed between the members as necessary or desired. The adhesive layer may be an Optically Clear Adhesive (OCA), or a Pressure Sensitive Adhesive (PSA) film, but is not particularly limited thereto. Adhesive layers described in more detail below may also include the same or substantially the same material as those described above, or may include a typical adhesive known to those having ordinary skill in the art.

The display panel 100 may be a component configured to generate or substantially generate an image. The display panel 100 may be an emissive display panel, for example, such as an organic light emitting display panel, an inorganic light emitting display panel, an organic-inorganic display panel, a quantum dot display panel, a micro LED display panel, or a nano LED display panel.

The sensor layer 200 may be disposed on the display panel 100. The sensor layer 200 may sense an external input that is applied from the outside. The external input may be a user input. The user input includes various suitable kinds of external inputs including, for example, a part of the user's body, a pen, light, heat, pressure, and/or the like.

The sensor layer 200 may be provided on the display panel 100 through continuous processes. In this case, the sensor layer 200 may be represented as being directly disposed on the display panel 100. As used herein, the phrase "directly disposed" may mean that a third element is not disposed between the two elements (e.g., the sensor layer 200 and the display panel 100). In other words, a separate adhesive member may not be disposed between the sensor layer 200 and the display panel 100. In another embodiment, the sensor layer 200 may be combined with the display panel 100 through an adhesive member. The adhesive member may include a typical adhesive known to those having ordinary skill in the art, or a pressure sensitive adhesive. In an embodiment of the present disclosure, the sensor layer 200 may be omitted as needed or desired.

The optical film 300 may lower a reflectance of external light incident from the outside (e.g., externally). The optical film 300 may include a retarder and/or a polarizer. The optical film 300 may be referred to as a polarization film. The optical film may be connected to (e.g., attached to or coupled to) the sensor layer 200 through the adhesive layer.

As another example, the optical film 300 may include color filters. The color filters may have a suitable array (e.g., a prescribed or predetermined array). The array of the color filters may be determined in consideration of the light emission colors of the pixels included in the display panel 100. The optical film 300 may further include a black matrix that is adjacent to the color filters.

As another example, the optical film 300 may include a destructive interference structure. For example, the destructive interference structure may include a first reflection layer and a second reflection layer disposed at (e.g., in or on) different layers from each other. First reflection light and second reflection light reflected by the first reflection layer and the second reflection layer, respectively, may destructively interfere with each other, and accordingly, an external light reflection ratio may be reduced.

The window 400 may be disposed on the optical film 300. The window 400 may include an insulation material that is optically transparent. For example, the window 400 may include glass or plastic. The window 400 may have a multilayered structure or a single-layer structure. For example, the window 400 may include a plurality of plastic films that are bonded to one another with an adhesive, or a glass substrate and a plastic film that are bonded to each other with an adhesive.

Figure 3:
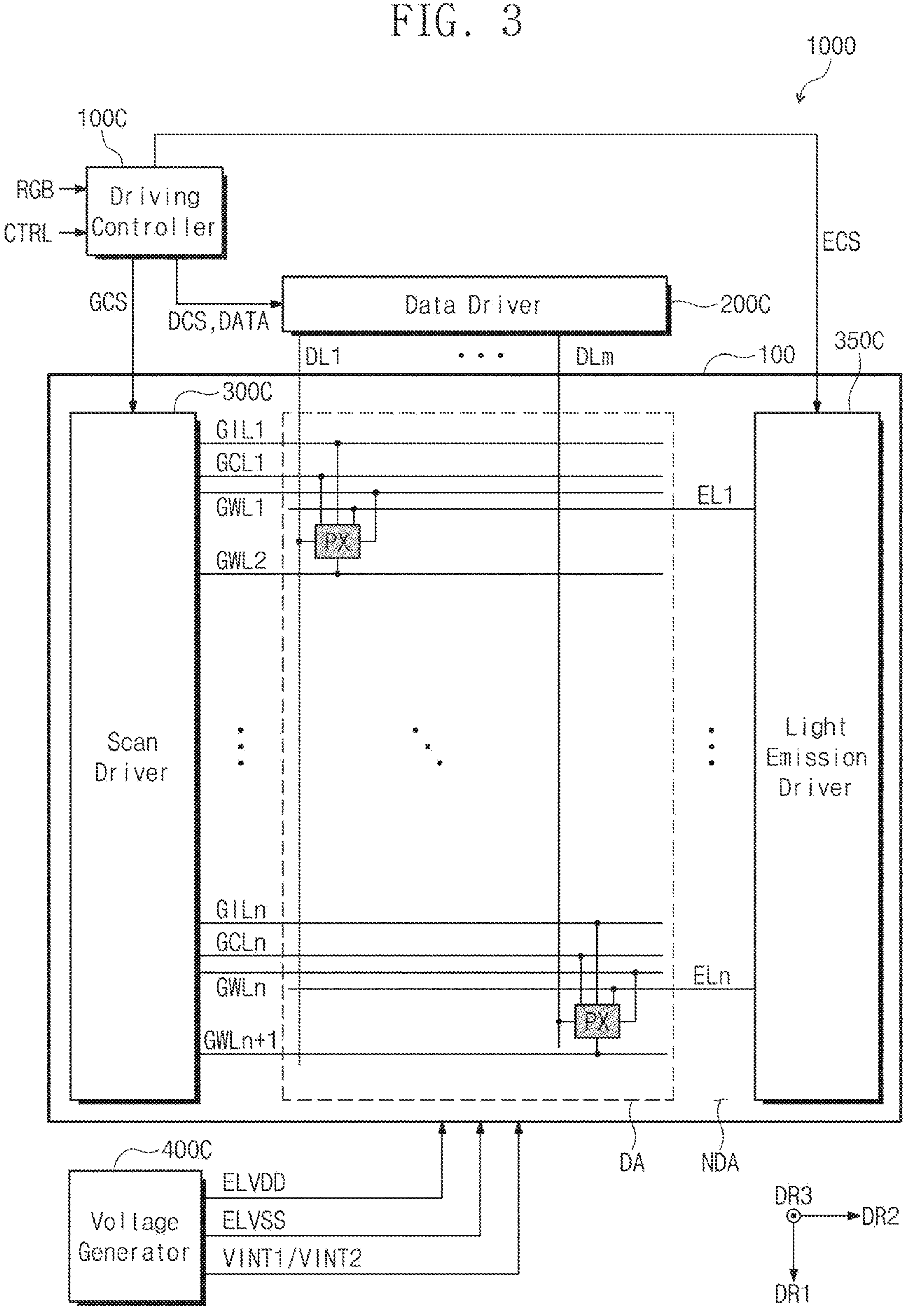
FIG. 3 is a block diagram of a display device according to an embodiment of the present disclosure.

FIG. 3 is a block diagram of a display device according to an embodiment of the present disclosure.

Referring to FIG. 3, the display device 1000 includes a display panel 100, a panel driver, and a driving controller 100C. As an example of the present disclosure, the panel driver may include a data driver 2000, a scan driver 3000, a light emission driver 350C, and a voltage generator 4000.

The driving controller 100C receives an image signal RGB and a control signal CTRL. The driving controller 100C may generate an image data signal DATA by converting the data format of the image signal RGB, so as to be matched with the specification of the interface with the data driver 2000. The driving controller 100C may output a first control signal GCS, a second control signal ECS, and a third control signal DCS.

The data driver 2000 may receive the third control signal DCS and the image data signal DATA from the driving controller 100C. The data driving circuit 2000 converts the image data signal DATA into data signals, and outputs the data signals to a plurality of data lines DL1 to DLm to be described in more detail below. The data signals may be analog voltages corresponding to a grayscale value of the image data signal DATA.

The scan driver 3000 may receive the first control signal GCS from the driving controller 100C. The scan driver 3000 may output scan signals to scan lines in response to the first control signal GCS.

The voltage generator 4000 generates voltages used for the operations of the display panel 100. In an embodiment, the voltage generator 4000 generates a first driving voltage ELVDD, a second driving voltage ELVSS, a first initialization voltage VINT1, and a second initialization voltage VINT2.

The display panel 100 may include a display area DA and a non-display area NDA. The display panel 100 may include a plurality of pixels PX disposed in the display area DA. The plurality of pixels PX may be arranged according to a suitable rule (e.g., a prescribed or predetermined rule).

The display panel 100 further includes the data lines DL1 to DLm, the scan lines, and emission control lines EL1 to ELn. The scan lines may include initialization scan lines GIL1 to GILn, compensation scan lines GCL1 to GCLn, and write scan lines GWL1 to GWLn. Here, m and n may be positive integers.

The data lines DL1 to DLm extend in the first direction DR1, and are spaced apart from each other in the second direction DR2. The initialization scan lines GIL1 to GILn, the compensation scan lines GCL1 to GCLn, the write scan lines GWL1 to GWLn, and the emission control lines EL1 to ELn extend in the second direction DR2. The initialization scan lines GIL1 to GILn, the compensation scan lines GCL1 to GCLn, the write scan lines GWL1 to GWLn, and the emission control lines EL1 to ELn are spaced apart from each other in the first direction DR1.

The plurality of pixels PX are electrically connected to the initialization scan lines GIL1 to GILn, the compensation scan lines GCL1 to GCLn, the write scan lines GWL1 to GWLn, the emission control lines EL1 to ELn, and the data lines DL1 to DLm. Each of the plurality of pixels PX may be electrically connected to four scan lines. For example, as shown in FIG. 3, the pixels PX in a first row may be connected to the first scan line GIL1, the first compensation scan line GCL1, the first write scan line GWL1, and the second write scan line GWL2. In addition, the pixels PX in an n-th row may be connected to the n-th scan line GILn, the n-th compensation scan line GCLn, the n-th write scan line GWLn, and the (n+1)-th write scan line GWLn+1. However, the present disclosure is not limited thereto, and the connection relationships between the plurality of pixels PX and the initialization scan lines GIL1 to GILn, the compensation scan lines GCL1 to GCLn, the write scan lines GWL1 to GWLn, the emission control lines EL1 to ELn, and the data lines DL1 to DLm may be variously modified as needed or desired, and is not limited to the example illustrated in FIG. 3.

The scan driver 3000 may be disposed in the non-display area NDA of the display panel 100. The scan driver 3000 may receive the first control signal GCS from the driving controller 100C. The scan driver 3000 outputs initialization scan signals to the initializations scan lines GIL1 to GILn in response to the first control signal GCS, and outputs compensation scan signals to the compensation scan lines GCL1 to GCLn. In addition, the scan driver 3000 may output write scan signals to the write scan lines GWL1 to GWLn in response to the first control signal GCS. As another example, the scan driver 3000 may include first and second scan drivers. The first scan driver may output the initialization scan signals and the compensation scan signals, and the second scan driver may output the write scan signals.

The emission driver 350C may be disposed in the non-display area NDA of the display panel 100. The emission driver 350C may receive the second control signal ECS from the driving controller 100C. The emission driver 350C may output emission control signals to the plurality of emission control lines EL1 to ELn in response to the second control signal ECS. As another example, the scan driver 3000 may be connected to the plurality of emission lines EL1 to ELn. In this case, the scan driver may output the emission control signals to the emission control lines EL1 to ELn.

Figure 4:
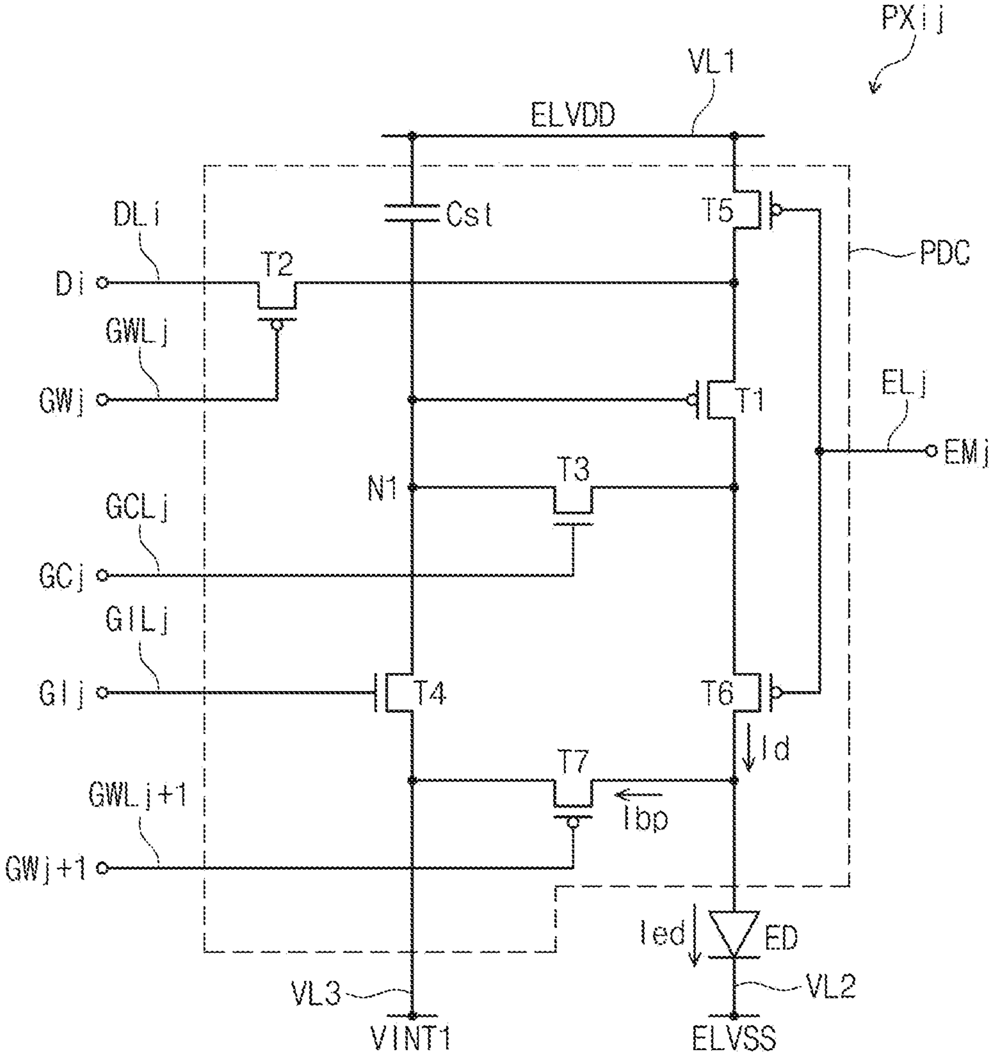
FIG. 4 is circuit diagram showing a pixel according to an embodiment of the present disclosure.

FIG. 4 is a circuit diagram showing a pixel according to an embodiment of the present disclosure. In FIG. 4, an example equivalent circuit diagram of one pixel PXij from among the plurality of pixels PX is shown. Because the plurality of pixels PX may have the same or substantially the same circuit structure as each other, the circuit structure of the pixel PXij will be described in more detail hereinafter, and redundant description of the other remaining pixels from among the plurality of pixels PX may not be repeated.

Referring to FIG. 4, the pixel PXij is connected to an i-th data line DLi from among the data lines DL1 to DLm, a j-th initialization scan line GILj from among the initialization scan lines GIL1 to GILn, a j-th compensation scan line GCLj from among the compensation scan lines GCL1 to GCLn, a j-th write scan line GWLj and a (j+1)-th write scan line GWLj+1 from among the write scan lines GWL1 to GWLn, and a j-th emission control line ELj from among the emission control lines EL1 to ELn.

The pixel PXij may include a light emitting element ED and a pixel driving circuit PDC. The light emitting element ED may include a light emitting diode. As an example of the present disclosure, the light emitting element ED may be an organic light emitting diode including an organic light emitting layer.

The pixel driving circuit PDC may include first to seventh transistors T1, T2, T3, T4, T5, T6, T7, and a storage capacitor (e.g., one storage capacitor) Cst. The first to seventh transistors T1 to T7 may be referred to as (e.g., may include) a driving thin-film transistor T1, a switching thin-film transistor T2, a compensation thin-film transistor T3, a first initialization thin-film transistor T4, an operation control thin-film transistor T5, a emission control thin-film transistor T6, and a second initialization thin-film transistor T7.

Some of the first to seventh transistors T1 to T7 may be P-type transistors, and the others may be N-type transistors. For example, the first, second, fifth, sixth, and seventh transistors T1, T2, T5, T6, and T7 may be PMOS transistors, and the third and fourth transistors T3 and T4 may be NMOS transistors.

At least one from among the first to seventh transistors T1 to T7 may be a transistor having a low-temperature polycrystalline silicon (LTPS) semiconductor layer, and at least one from among the first to seventh transistors T1 to T7 may be a transistor having an oxide semiconductor layer.

In more detail, the first transistor T1, which directly influences the brightness of the display device, may be configured to include a semiconductor layer composed of a high reliable polycrystalline silicon, and thus, a display device having a high resolution may be implemented.

On the other hand, the oxide semiconductor has a high carrier mobility and a low leakage current, and thus, a voltage drop may not be large even with a long driving time. In other words, because a color change in an image according to the voltage drop may not be large even in a low frequency driving mode, low frequency driving may be possible. As such, the oxide semiconductor may desirably have a small leak current, and thus, at least one of the third transistor T3 connected to a driving gate electrode of the first transistor T1 or the fourth transistor T4 may employ (e.g., may be formed of) the oxide semiconductor to prevent or substantially prevent the leak current, which may flow to the driving gate electrode, and also, power consumption may be reduced.

Each of the first, second, fifth, sixth, and seventh transistors T1, T2, T5, T6, and T7 may be a transistor having an LTPS transistor layer, and each of the third and fourth transistors T3 and T4 may be a transistor having an oxide semiconductor layer.

The configuration of the pixel driving circuit PDC is not limited to the embodiment shown in FIG. 4. The pixel driving circuit PDC shown in FIG. 4 is provided as an example, and thus, the configuration of the pixel circuit PDC may be variously modified as needed or desired. For example, all of the first to seventh transistors T1 to T7 may be P-type transistors, or N-type transistors.

The j-th initialization scan line GILj, the j-th compensation scan line GCLj, the j-th write scan line GWLj, the (j+1)-th write scan line GWLj+1, and the j-th emission control line EMj may respectively transfer, to the pixel PXij, a j-th initialization scan signal GIj, a j-th compensation scan signal GCj, a j-th write scan signal GWj, a (j+1)-th write scan signal GWj+1, and a j-th emission control signal ELj. The i-th data line DLi transfers an i-th data signal Di to the pixel PXij. The i-th data signal Di may have a voltage level corresponding to the image signal RGB (e.g., see FIG. 3) to be input to the display device 1000.

A first driving voltage line VL1 and a second driving voltage line VL2 may respectively transfer, to the pixel PXij, the first driving voltage ELVDD and the second driving voltage ELVSS. In addition, a first initialization voltage line VL3 may transfer a first initialization voltage VINT1 to the pixel PXij.

The first transistor T1 is connected between the first driving voltage line VL1 for receiving the first driving voltage and the light emitting element ED. The first transistor T1 includes a first electrode connected to the first driving voltage line VL1 via the fifth transistor T5, a second electrode electrically connected to an anode of the light emitting element ED via the sixth transistor T6, and a third electrode (e.g., a gate electrode) connected to one end of the storage capacitor Cst. The first transistor T1 may receive the i-th data signal Di transferred by the i-th data line DLi according to a switching operation of the second transistor T2, and may provide a driving current Id to the light emitting element ED.

The second transistor T2 is connected between the data line DLi and the first electrode of the first transistor T1. The second transistor T2 includes a first electrode connected to the data line DLi, a second electrode connected to the first electrode of the first transistor T1, and a gate connected to the j-th write scan line GWLj. The second transistor T2 may be turned on in response to the j-th write scan signal GWj transferred via the j-th write scan line GWLj, to transfer the i-th data signal Di, which has been transferred from the i-th data line DLi, to the first electrode of the first transistor T1.

The third transistor T3 is connected between the second electrode of the first transistor T1 and a first node N1. The third transistor T3 includes a first electrode connected to the third electrode of the first transistor T1, a second electrode connected to the second electrode of the first transistor T1, and a gate connected to the j-th compensation scan line GCLj. The third transistor T3 may be turned on in response to the j-th compensation scan signal GCj transferred via the j-th compensation scan line GCLj, to connect the third electrode (e.g., the gate) and the second electrode of the first transistor T1 to each other to diode-connect the first transistor T1.

The fourth transistor T4 is connected between the first initialization voltage line VL3 through which the first initial voltage VINT1 is applied and the first node N1. The fourth transistor T4 includes a first electrode connected to the gate of the first transistor T1, a second electrode connected to the first initialization voltage line VL3 through which the first initialization voltage VINT1 is transferred, and a gate connected to the j-th initialization scan line GILj. The fourth transistor T4 is turned on in response to the j-th initialization scan signal GIj transferred via the j-th initialization scan line GILj. The turned-on fourth transistor T4 transfers the first initialization voltage VINT1 to the gate of the first transistor T1, to initialize a potential at the gate of the first transistor T1 (i.e., the potential of the first node N1).

The fifth transistor T5 includes a first electrode connected to the first driving voltage line VL1, a second electrode connected to the first electrode of the first transistor T1, and a gate connected to the j-th emission control line ELj.

The sixth transistor T6 includes a first electrode connected to the second electrode of the first transistor T1, a second electrode connected to the anode of the light emitting element ED, and a gate connected to the j-th emission control line ELj.

The fifth and sixth transistors T5 and T6 may be concurrently or substantially simultaneously turned on with each other in response to the j-th emission control signal EMj transferred via the j-th emission control line ELj. The first driving voltage ELVDD applied through the turned on fifth transistor T5 may be compensated for through the diode-connected first transistor T1, and then transferred to the light emitting element ED.

The seventh transistor T7 includes a first electrode connected to the first initialization voltage line VL3 to which the first initialization voltage VINT1 is applied, a second electrode connected to the second electrode of the sixth transistor T6, and a gate connected to the (j+1)-th write scan line GWLj+1. As an example of the present disclosure, the first initialization voltage VINT1 may have a negative electrostatic voltage. For example, the first initialization voltage VINT1 may be about −3.5 V, but is not particularly limited thereto.

As described above, one end of the storage capacitor Cst is connected to the gate of the first transistor T1, and the other end of the storage capacitor Cst is connected to the first driving voltage line VL1. A cathode of the light emitting diode ED may be connected to the second driving voltage line VL2 configured to transfer the second driving voltage ELVSS. The second driving voltage ELVSS may have a lower level than that of the first driving voltage ELVDD. As an example of the present disclosure, the second driving voltage ELVSS may have a lower level than that of the first initialization voltage VINT1.

During an activation period of the j-th initialization scan signal GIj, when the j-th initialization scan signal GIj of a turn-on level (e.g., a high level) is applied through the j-th initialization scan line GILj, the fourth transistor T4 is turned on in response to the j-th initialization scan signal GIj of the turn-on level (e.g., the high level). The first initialization voltage VINT1 is transferred to the gate of the first transistor T1 through the turned-on fourth transistor T4, and the first node N1 (e.g., the gate of the first transistor T1) is initialized by the first initialization voltage VINT1. Accordingly, the activation period of the j-th initialization scan signal GIj may be an initialization period of the pixel PXij.

Next, the j-th compensation scan signal GCj may be activated, and during the activation period of the j-th compensation scan signal GCj, the third transistor T3 is turned on. For example, the third transistor T3 is turned on when the j-th compensation scan signal GCj of a turn-on level (e.g., a high level) is applied through the j-th compensation scan line GCj. The first transistor T1 is diode-connected and biased in a forward direction by the turned-on third transistor T3.

In addition, within the activation period of the j-th compensation scan signal GCj, the j-th write scan signal GWj may be activated. The j-th write scan signal GWj has a turn-on level (e.g., a low level) during the activation period. During the activation period of the j-th write scan signal GWj, the second transistor T2 is turned on by the j-th write scan signal GWj of the turn-on level (e.g., the low level). Then, a compensation voltage "Di-Vth", which is reduced by a threshold voltage Vth of the first transistor T1 from the i-th data signal Di supplied from the data line DLi, is applied to the gate of the first transistor T1. In other words, the potential of the gate of the first transistor T1 may be the compensation voltage "Di-Vth".

The first driving voltage ELVDD and the compensation voltage "Di-Vth" are applied to both ends of the capacitor Cst, and charges corresponding to a voltage difference thereof may be stored in the storage capacitor Cst. Here, the turn-on level period (e.g., the high level period) of the j-th compensation scan signal GCj may be referred to as a compensation period of the pixel PXij.

The (j+1)-th write scan signal (GWj+1) is then activated. The (j+1)-th write scan signal (GWj+1) has a turn-on level (e.g., a low level) during the activation period. During the activation period of the (j+1)-th write scan signal (GWj+1), the seventh transistor T7 is turned on. A portion of the driving current Id may be a bypass current Ibp that may get out through the seventh transistor T7.

Even when a minimum current of the first transistor T1, which displays a black image, flows as the driving current, the black image may not be properly displayed if the light emitting element ED emits light. Accordingly, the seventh transistor T7 in the pixel PXij according to an embodiment of the present disclosure may pass, as the bypass current Ibp, a portion of the minimum current of the first transistor T1 to a current path other than a current path to the light emitting element. Here, the minimum current of the first transistor T1 means a current under a condition that a gate-source voltage Vgs of the first transistor T1 is smaller than the threshold voltage Vth to turn off the first transistor T1. Under such a condition of turning off the first transistor T1, the minimum driving current (for example, a current of 10 pA or smaller) may be transferred to the light emitting element ED to display a black luminance image. When the minimum driving current for displaying the black image flows, an influence by the bypass current Ibp may be large. However, when a large driving current for displaying a typical image or a white image flows, there may be little influence by the bypass current Ibp. Accordingly, when the driving current for displaying the black image flows, the emission current Ied of the light emitting element ED, which is reduced from the driving current Id by a current amount of the bypass current Ibp bypassed through the seventh transistor T7, may have a minimum current amount that may reliably display the black image. Accordingly, a contrast ratio may be improved by implementing an accurate black luminance image using the seventh transistor T7.

Then, the j-th emission control signal EMj applied from the j-th emission control line ELj changes from a turn-off level (e.g., a high level) to a turn-on level (e.g., a low level). The fifth and sixth transistors T5, T6 are turned on by the emission control signal EMj. Thus, the driving current Id is generated according to the difference between the gate voltage of the first transistor T1 and the first driving voltage ELVDD, and the driving current Id is supplied to the light emitting element ED via the sixth transistor T6, so that the current Ied flows to the light emitting element ED.

Figure 5:
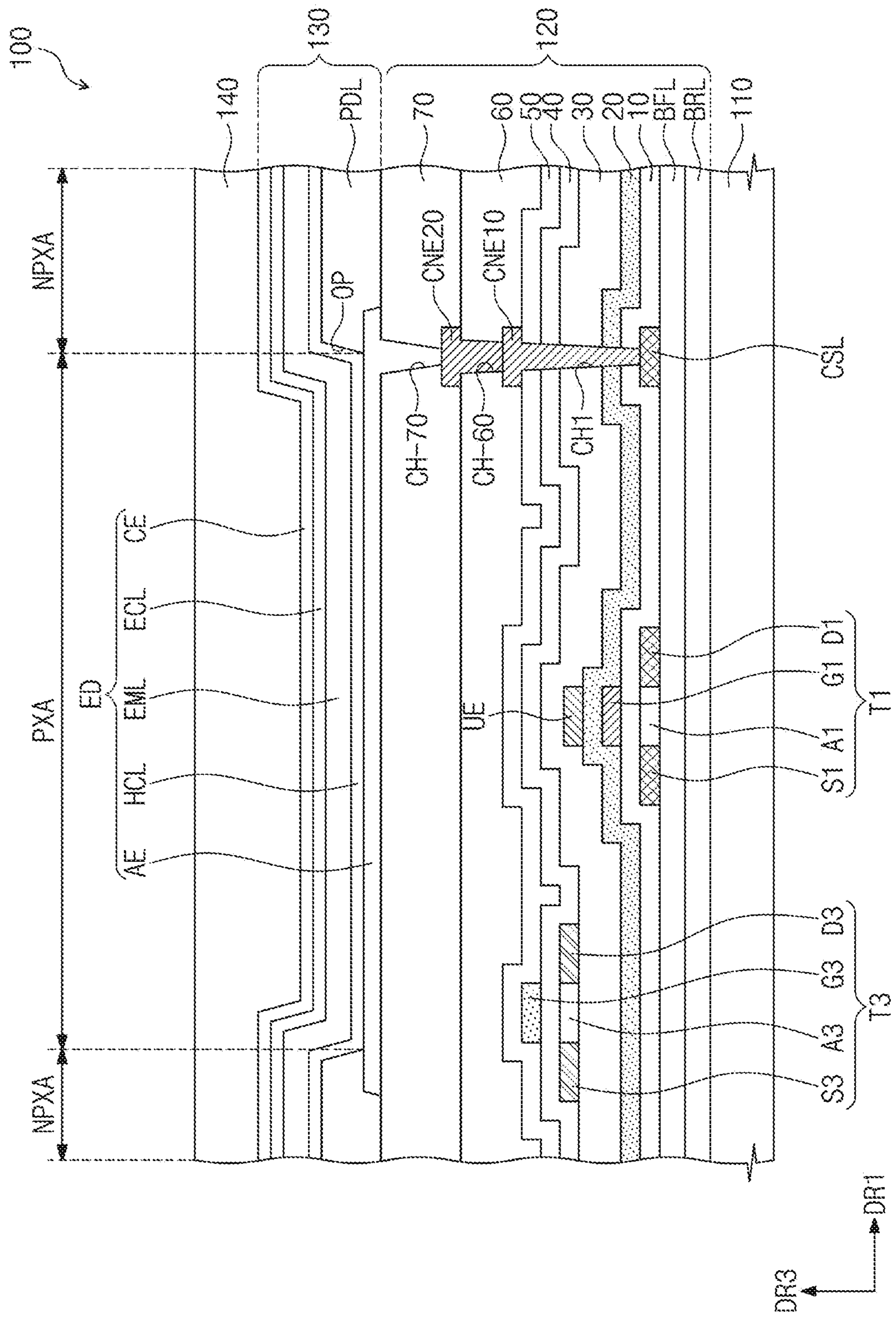
FIG. 5 is a cross-sectional view of a pixel of a display panel according to an embodiment of the present disclosure.

FIG. 5 is a cross-sectional view of a pixel of a display panel according to an embodiment of the present disclosure.

Referring to FIG. 5, the display panel 100 may include a substrate 110, and a circuit layer 120, an element layer 120, and an encapsulation layer 140 disposed on the substrate 110.

The substrate 110 may be a member for providing a base surface on which the circuit layer 120 is disposed. The substrate 110 may be a rigid substrate, or a flexible substrate that is bendable, foldable, rollable, or the like. The substrate 110 may be a glass substrate, a metal substrate, a polymer substrate, or the like. However, the present disclosure is not limited thereto, and the substrate 110 may be an inorganic layer, an organic layer, or a composite material layer.

The substrate 110 may have a multilayered structure. For example, the substrate 110 may include a first synthetic resin layer, an intermediate layer of a multilayered or single layer structure, and a second synthetic resin layer disposed on the intermediate layer. The intermediate layer may be referred to as a base barrier layer. The intermediate layer may include a silicon oxide (SiOx) layer, and an amorphous silicon (a-Si) layer disposed on the silicon oxide layer, but is not particularly limited thereto. For example, the intermediate layer may include at least one from among a silicon oxide layer, a silicon nitride layer, a silicon oxynitride layer, or an amorphous silicon layer.

Each of the first and second synthetic resin layers may include a polyimide-based resin. In addition, each of the first and second synthetic resin layers may include at least one from among an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. Further, in the present embodiment, "~"-based resin means including a functional group of "~".

At least one inorganic layer is provided on the top surface of the substrate 110. The inorganic layer may include at least any suitable one from among aluminum oxide, titanium oxide, silicon oxide, silicon oxynitride, zirconium oxide, or halfnium oxide. The inorganic layer may be provided with multiple layers. The multiple inorganic layers may constitute a barrier layer BRL and/or a buffer layer BFL to be described in more detail below. The barrier layer BRL and the buffer layer BFL may be selectively (e.g., optionally) disposed.

The barrier layer BRL prevents or substantially prevents inflow of foreign matters from the outside. The barrier layer BRL may include a silicon oxide layer and a silicon nitride layer. Each of these layers may be provided in a plurality, and the silicon oxide layers and the silicon nitride layers may be alternately disposed (e.g., alternately laminated).

The buffer layer BFL may be disposed on the barrier layer BRL. The buffer layer BFL may improve a bonding force between the substrate 110 and a semiconductor pattern and/or a conductive pattern. The buffer layer BFL may include silicon oxide layers and silicon nitride layers. The silicon oxide layers and the silicon nitride layers may be alternately disposed (e.g., alternately laminated).

The semiconductor pattern may be disposed on the buffer layer BFL. Hereinafter, the semiconductor pattern that is directly disposed on the buffer layer BFL is defined as a first semiconductor pattern. The first semiconductor pattern may include a silicon semiconductor. The first semiconductor pattern may include polysilicon. However, the present disclosure is not limited thereto, and the first semiconductor pattern may include amorphous silicon.

FIG. 5 illustrates a portion of the first semiconductor pattern that is disposed on the buffer layer BFL, and the first semiconductor pattern may be further disposed in another area of the pixel PXij. The first semiconductor pattern may be arranged in a suitable rule (e.g., a specific or predetermined rule) across the pixels PX. The first semiconductor pattern may have different electrical properties according to whether it is doped or not. The first semiconductor pattern may include a first area having a high conductivity, and a second area having a low conductivity. The first area may be doped with an N-type dopant or a P-type dopant. A P-type transistor includes a doped region doped with a P-type dopant, and an N-type transistor includes a doped area doped with an N-type dopant. The second area may be a non-doped area, or may be doped at a lower concentration than that of the first area.

The first area may have a greater conductivity than that of the second area, and may operate or substantially operate as an electrode or a signal line. The second area may correspond to or substantially correspond to an active area (e.g., a channel) of a transistor. In other words, a portion of the semiconductor pattern may be the active area of the transistor, another portion may be a source or a drain, and another portion may be a connection electrode or a signal connection line.

As shown in FIG. 5, the first electrode S1, a channel part A1, and the second electrode D1 may be provided from the first semiconductor pattern. The first electrode S1 and the second electrode D1 of the first transistor T1 extend in opposite directions to each other from the channel part A1.

FIG. 5 illustrates a portion of the signal connection line CSL provided from the semiconductor pattern. The connection signal line CSL may be connected to the second electrode of the sixth transistor T6 in a plan view.

The first insulation layer 10 may be disposed on the buffer layer BFL. The first insulation layer 10 may commonly overlap with the plurality of pixels PX, and may cover the first semiconductor pattern. The first insulation layer 10 may include an inorganic material and/or an organic material, and may have a single layer or multilayered structure. The first insulation layer 10 may include at least one from among aluminum oxide, titanium oxide, silicon oxide, silicon oxynitride, zirconium oxide, or hafnium oxide. In the present embodiment, the first insulation layer 10 may be a single layer of a silicon oxide layer. Not only the first insulation layer 10, but also the insulation layer of the circuit layer 120, which will be described in more detail below, may include an inorganic material and/or organic material, and may have a single layer or multilayered structure. The inorganic material layer may include at least one from among the aforementioned materials, but is not limited thereto.

The gate G1 of the first transistor T1 is disposed on the first insulation layer 10. The third electrode G1 may be a portion of the first conductive pattern. The gate G1 of the first transistor T1 may overlap with the channel part A1 of the first transistor T1. In a process for doping the first semiconductor pattern, the gate G1 of the first transistor T1 may function as a mask.

The second insulation layer 20 may be disposed on the first insulation layer 10, and may cover the gate G1 of the first transistor T1. The second insulation layer 20 may include an inorganic layer and/or organic layer, and may have a single layer or multilayered structure. The second insulation layer 20 may include at least one from among silicon oxide, silicon nitride, or silicon oxynitride. In the present embodiment, the second insulation layer 20 may have a multi-layered structure including a silicon oxide layer and a silicon nitride layer.

A third insulation layer 30 may be disposed on the second insulation layer 20. The third insulation layer 30 may have a single layer or multi-layered structure. For example, the third insulation layer 30 may have a multilayered structure including silicon oxide layers and silicon nitride layers. An upper electrode UE of the storage capacitor Cst may be disposed between the second insulation layer 20 and the third insulation layer 30. In addition, a lower electrode of the storage capacitor Cst may be disposed between the first insulation layer 10 and the second insulation layer 20. For example, in some embodiments, the gate G1 may function as the lower electrode of the storage capacitor Cst.

In an embodiment of the present disclosure, the second insulation layer 20 may be replaced with an insulation pattern. The upper electrode UE may be disposed on the insulation pattern. The upper electrode UE may serve as a mask used for providing an insulation pattern from the second insulation layer 20.

The second semiconductor pattern may be disposed on the third insulation layer 30. The second semiconductor pattern may include an oxide semiconductor. The oxide semiconductor may include a plurality of areas that are divided according to whether or not a metal oxide is reduced. An area (hereinafter, a reduced area) in which the metal oxide is reduced has a higher conductivity in comparison to an area (hereinafter, a non-reduced area) in which the metal oxide is not reduced. The reduced area may serve or substantially serve as a source/drain or a signal line of the transistor. The non-reduced area corresponds to or substantially corresponds to an active area (e.g., the semiconductor area, the channel part, and the like) of the transistor. In other words, a portion of the second semiconductor pattern may be the active area of the transistor, another portion may be a source/drain area of the transistor, and another portion may be a signal transfer area.

As shown in FIG. 5, the first electrode S3, a channel part A3, and the second electrode D3 of the third transistor T3 may be provided from the second semiconductor pattern. Each of the first electrode S3 and the second electrode D3 may include a metal that is reduced from a metal-oxide-semiconductor. Each of the first electrode S3 and the second electrode D3 may have a metal layer having a suitable thickness (e.g., a prescribed or predetermined thickness) from the top surface of the second semiconductor pattern, and including the reduced metal.

A fourth insulation layer 40 may be arranged on the third insulation layer 30. The fourth insulation layer 40 may commonly overlap with the plurality of pixels PX, and may cover the second semiconductor pattern. The fourth insulation layer 40 may include at least one from among aluminum oxide, titanium oxide, silicon oxide, silicon nitride, silicon oxynitride, zirconium oxide, or hafnium oxide.

The gate G3 of the third transistor T3 may be disposed on the fourth insulation layer 40. The gate G3 may be a portion of the third conductive pattern. The gate G3 of the third transistor T3 may overlap with the channel part A3 of the third transistor T3. In a process for doping the second semiconductor pattern, the gate G3 of the third transistor T3 may function as a mask.

In an embodiment of the present disclosure, the fourth insulation layer 40 may be replaced with an insulation pattern. The gate G3 of the third transistor T3 may be disposed on the insulation pattern. In the embodiment, the gate G3 may have the same or substantially the same shape as that of the insulation pattern in a plan view. In the embodiment, a single gate G3 is shown for convenience of illustration, but the third transistor T3 may also include two electrodes (e.g., two gates).

The fifth insulation layer 50 may be disposed on the fourth insulation layer 40, and may cover the gate G3 of the third transistor T3. The fifth insulation layer 50 may be an inorganic layer and/or an organic layer, and have a single layer or multilayered structure. For example, the fifth insulation layer 50 may include silicon oxide layers and silicon nitride layers. The fifth insulation layer 50 may include a plurality of silicon oxide layers and silicon nitride layers that are alternately disposed (e.g., alternately laminated).

The first and second electrodes of the fourth transistor T4 (e.g., see FIG. 4) may be provided through the same processes as those of the first electrode S3 and the second electrode D3 of the third transistor T3. In addition, the first and second electrodes of the reset transistor ST1 (e.g., see FIG. 4), and the first and second electrodes of the output transistor ST3 of the pixel PXij may be concurrently provided with the first and second electrodes S3 and D3 of the third transistor T3.

The first connection electrode CNE10 may be disposed on the fifth insulation layer 50. The first connection electrode CNE10 may be connected to the connection signal line CSL through a contact hole CH1 penetrating through the first to fifth insulation layers 10, 20, 30, 40 and 50.

A sixth insulation layer 60 may be disposed on the fifth insulation layer 50. A second connection electrode CNE20 may be disposed on the sixth insulation layer 60. The second connection electrode CNE20 may be connected to the first connection electrode CNE10 through a contact hole CH-60 penetrating through the sixth insulation layer 60. A seventh insulation layer 70 may be disposed on the sixth insulation layer 60, and may cover the second connection electrode CNE20.

Each of the sixth and seventh insulation layers 60 and 70 may be an organic layer. For example, each of the sixth and seventh insulation layers 60 and 70 may include a general purpose polymer, such as Benzocyclobutene (BCD), polyimide, Hexamethyldisiloxane (HMDSO), Polymethylmethacrylate (PMMA), or Polystyrene (PS), a polymer derivative having a phenol-based group, an acrylic-based polymer, an imide-based polymer, an aryl ether-based polymer, an amide-based polymer, a fluorine-based polymer, a p-xylene-based polymer, a vinyl alcohol-based polymer, or a suitable blend thereof.

The element layer 130 may include the light emitting element ED and a pixel definition layer PDL. The light emitting element ED may include an anode AE, a hole control layer HCL, a light emitting layer EML, an electronic control layer ECL, and a cathode CE.

The anode AE may be disposed on the seventh insulation layer 70. The anode AE may be connected with the second connection electrode CNE20 through a contact hole CH-70 penetrating through the seventh insulation layer 70. The anode AE may be a (semi-) transmissive electrode or a reflective electrode. In an embodiment, the anode AE may include a reflective layer composed of Ag, Mg, Al, Pt, Pd, Au, Ni, Nd, Ir, Cr, or a suitable compound thereof, and a transparent or semi-transparent electrode layer provided on the reflective layer. The transparent or semi-transparent electrode layer may include at least one selected from the group consisting of indium tin oxide (ITO), indium zinc oxide (IZO), indium gallium zinc oxide (IGZO), indium oxide ($In_2O_3$), and aluminum zinc oxide (AZO) doped with aluminum. For example, the anode AE may be provided with ITO/Ag/ITO.

The pixel definition layer PDL may be disposed on the seventh insulation layer 70. In an embodiment, the pixel definition layer PDL may have a light absorption property, and include, for example, a black color. The pixel definition layer PDL may include a black coloring agent. The black coloring agent may include a black dye or a black pigment. The black coloring agent may include carbon black, aniline black, a suitable metal such as chromium, or suitable oxides thereof. The pixel definition layer PDL may be provided with a mixture of a blue organic material and a black organic material. The pixel definition layer PDL may include a lyophobic organic material.

An opening OP in the pixel definition layer PDL exposes at least a portion of the anode AE of the light emitting element ED. The opening OP in the pixel definition layer PDL may define a light emitting area PXA. For example, the plurality of pixels PX (e.g., see FIG. 3) may be disposed on a plane of the display panel 100 in a suitable rule (e.g., a certain or predetermined rule). An area in which the plurality of pixels PX are disposed may be defined as a pixel area, and one pixel area may include the light emitting area PXA and a non-light emitting area NPXA adjacent to the light emitting area PXA. The non-light emitting area NPXA may surround (e.g., around a periphery of) the light emitting area PXA.

The hole control layer HCL may be commonly disposed in the light emitting area PXA and the non-light emitting area NPXA. A common layer, such as the hole control layer HCL, may be commonly provided in the plurality of pixels PX. The hole control layer HCL may include a hole transport layer and a hole injection layer.

The light emitting layer EML is disposed on the hole control layer HCL. The light emitting layer EML may be commonly disposed in the plurality of pixels PX. In other words, the light emitting layer EML may be commonly disposed in the light emitting area PXA and the non-light emitting area NPXA. For example, the light emitting layer EML may be commonly provided by an open mask in both of the light emitting area PXA and the non-light emitting area NPXA. In this case, the light emitting layer EML may generate source light of white light or blue light. In addition, the light emitting layer EML may have a multilayered structure.

The display device 1000 (e.g., see FIG. 2) may further include a light control layer configured to control the color of the source light. For example, the light control layer may be provided between the sensor layer 200 (e.g., see FIG. 2) and the optical film 300. The light control layer may convert the optical property of the source light generated in the light emitting layer EML. The light control layer may include a light conversion pattern configured to convert the source light into different color light, and a scattering pattern configured to scatter the source light. As another example, the optical film 300 (e.g., see FIG. 2) including the color filters may pass only the colors corresponding to the respective color filters, without the addition of the light control layer.

In another embodiment of the present disclosure, the light emitting layer EML may be disposed in (e.g., only in) an area corresponding to the opening OP. In this case, the light emitting layer EML may be provided in a plurality, and the plurality of light emitting layers EML may be separately provided in the plurality of pixels PX. The light emitting layers EML may generate the source light of white light or blue light. As another example, some of the light emitting layers EML may generate red light, others may generate green light, and the others may generate blue light. However, the present disclosure is not limited thereto, and some of the light emitting layers EML may generate mixed-color light, for example, such as magenta light, yellow light, or cyan light.

An electron control layer ECL is disposed on the light emitting layer EML. The electron control layer ECL may include an electron transport layer and an electron injection layer. The cathode CE of the light emitting element ED is disposed on the electron control layer ECL. The electron control layer ECL and the cathode CE are commonly disposed in the plurality of pixels PX.

The encapsulation layer 140 is disposed on the cathode CE. The encapsulation layer 140 may cover the plurality of pixels PX. In an embodiment, the encapsulation layer 140 may directly cover the cathode CE. In an embodiment of the present disclosure, the display panel 100 may further include a capping layer directly covering the cathode CE. In an embodiment of the present disclosure, the light emitting element ED may also have a laminate structure that is vertically inverted from the structure shown in FIG. 5.

The encapsulation layer 140 may be disposed on the element layer 130. The encapsulation layer 140 includes at least an inorganic layer or an organic layer. In an embodiment of the present disclosure, the encapsulation layer 140 may include two inorganic layers, and an organic layer interposed therebetween. In an embodiment of the present disclosure, a thin-film encapsulation layer may include a plurality of inorganic layers and a plurality of organic layers alternately disposed (e.g., alternately laminated) on each other.

The encapsulation organic layer protects the light emitting element ED from moisture/oxygen, and from foreign matters, such as dust particles. The encapsulation inorganic layer may include a silicon nitride layer, a silicon oxynitride layer, a silicon oxide layer, a titanium oxide layer, an aluminum oxide layer, or the like, but is not particularly limited thereto. The encapsulation organic layer may include an acrylic-based inorganic layer, but is not particularly limited thereto.

Figure 6A:
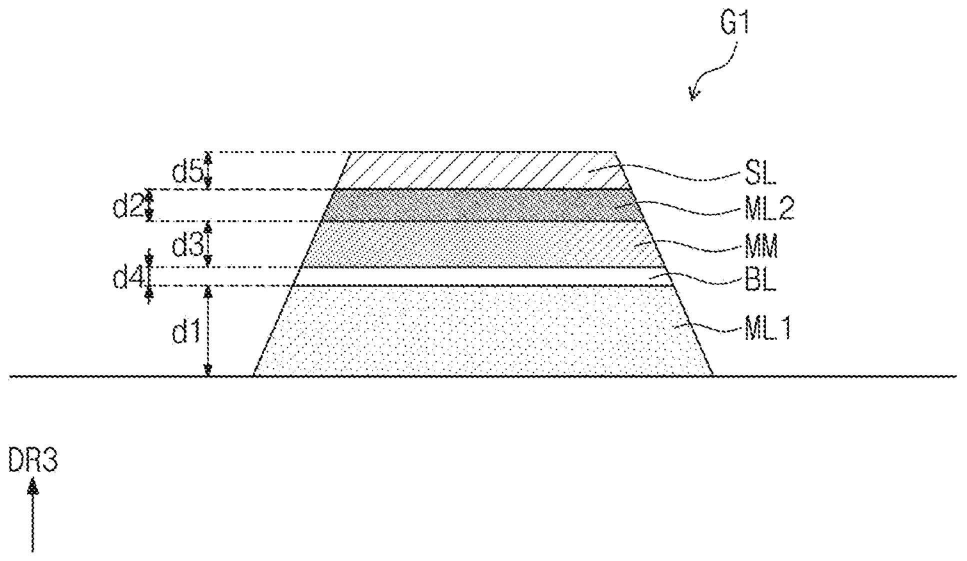
FIGS. 6A and 6B are cross-sectional views of conductive patterns according to one or more embodiments of the present disclosure.
Figure 6B:
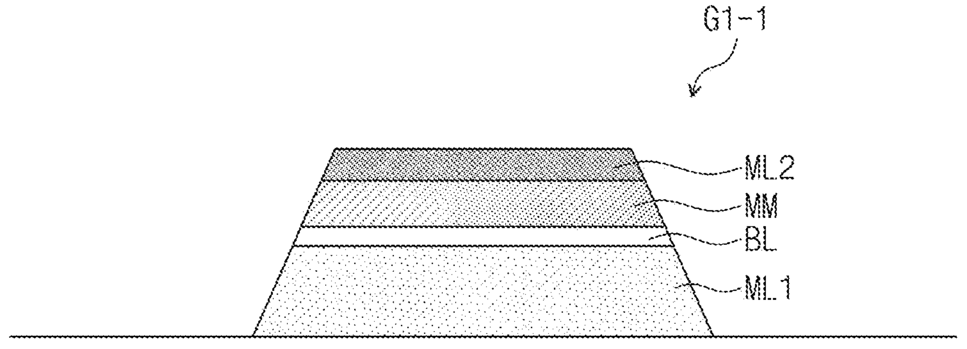

FIGS. 6A and 6B are cross-sectional views of conductive patterns according to one or more embodiments of the present disclosure. In FIGS. 6A and 6B, cross-sectional views of the gate G1, which is the gate G1 of the first transistor T1 shown in FIG. 5, are illustrated in more detail.

Referring to FIG. 6A, the gate G1 (hereinafter, a conductive pattern) may have a laminated structure including a plurality of layers. The conductive pattern G1 may include a first conductive layer ML1, a blocking layer BL, a second conductive layer ML2, and a shielding layer SL. In some embodiments, the conductive pattern G1 may further include a capping layer.

The first conductive layer ML1 may include a conductive material. The first conductive layer ML1 may have a lower resistance than those of the other layers (e.g., BL, ML2, and SL). The first conductive layer ML1 may have a resistance of 0.5Ω or lower. For example, the first conductive layer ML1 may include aluminum (Al), but is not limited thereto.

The conductivity of the first conductive layer ML1 may determine or substantially determine the conductivity of the conductive pattern G1. In other words, as the resistance of a material composing the first conductive material ML1 is lowered, the conductive pattern G1 having lower resistance characteristics may be provided. According to one or more embodiments of the present disclosure, through the low resistance characteristics of the conductive pattern G1, the display panel 100 (e.g., see FIG. 5) may be driven at high speeds, and an RC delay may be easily overcome. Thus, the display panel 100 having a high resolution may be implemented, the display characteristics may be enhanced, and the power consumption may be reduced.

The second conductive layer ML2 includes a second material. The second material may be conductive. The second material may be different from the first material. The second material may have a higher rigidity than that of the first material. The second conductive layer ML2 may block an etching gas from contacting the first conductive layer ML1 in a dry etching process for providing a contact hole (e.g., CH1 in FIG. 5). Accordingly, the first conductive layer ML1 may be prevented or substantially prevented from being damaged. The second material may have a higher anti-corrosiveness than that of the first material. For example, when the etching gas is a fluorine-based gas and the first conductive layer ML1 includes aluminum, the second conductive layer ML2 may include titanium, but the present disclosure is not limited thereto.

The first conductive layer ML1 may have a first thickness d1. The second conductive layer ML2 may have a second thickness d2. The second thickness d2 may be thinner than the first thickness d1. The first thickness d1 may vary according to the resistance desired in the conductive pattern G1. The larger the first thickness d1, the smaller the resistance of the first conductive layer ML1. For example, when the first conductive layer ML1 includes aluminum, the first conductive layer ML1 may have a surface resistance of about 0.13 (ohm/sq) in a case where the first thickness d1 is about 2500 Å, and may have a surface resistance of about 0.08 (ohm/sq) in a case where the first thickness d1 is about 3500 Å.

An intermediate layer MM is disposed between the first conductive layer ML1 and the second conductive layer ML2. The intermediate layer MM may directly contact the bottom surface of the second conductive layer ML2. In addition, in the present embodiment, the boundary between the intermediate layer MM and the second conductive layer ML2 is shown as a straight line, but the present disclosure is not limited thereto. The boundary between the intermediate layer MM and the second conductive layer ML2 may appear to be indistinct from each other on a cross section (e.g., in a cross-sectional view).

During heat treatment, the second conductive layer ML2 may diffuse for a material composing the first conductive layer ML1. The intermediate layer MM may be provided by diffusion of the second conductive layer ML2. Accordingly, the intermediate layer MM may include the first material composing the first conductive layer ML1, and the second material composing the second conductive material. The intermediate layer MM may include a third material that may be an alloy of the first material and the second material. For example, the intermediate layer MM may include an alloy of a metal composing the first conductive layer ML1 and a metal composing the second conductive layer ML2. In other words, the intermediate layer MM may include an aluminum and titanium alloy (e.g., an AlTi alloy), but is not limited thereto.

The intermediate layer MM may have a third thickness d3. The third thickness d3 may be determined or substantially determined by the position of the blocking layer BL. During the heat treatment, the intermediate layer MM may be provided while a material composing the second conductive layer ML2 diffuses to the blocking layer BL. In other words, the third thickness d3 may be determined by a separation distance from the second conductive layer ML2 to the blocking layer BL, which will be described in more detail below. The third thickness d3 may be a factor for increasing the resistance of the conductive pattern G1, and may be designed to be smaller than at least the first thickness d1. Accordingly, the influence of the intermediate layer MM to the conductivity of the conductive pattern G1 may be reduced.

The blocking layer BL is disposed between the first conductive layer ML1 and the intermediate layer MM. Although shown as directly contacting the first conductive layer ML1 and the intermediate layer MM, the blocking layer BL only needs to be positioned between the first conductive layer ML1 and the intermediate layer MM, and is not limited to any particular embodiment.

The blocking layer BL may include a suitable material having a small change due to heat. For example, the blocking layer BL may include a stable material, the physical characteristics of which, such as the crystal structure, do not change at a temperature of about 600 degrees or lower. The blocking layer BL may include a nitride of the second material. For example, the blocking layer BL may include titanium nitride, but is not limited thereto.

The blocking layer BL has a fourth thickness d4. The fourth thickness may be relatively thinner than the first thickness d1 and/or the third thickness d3. For example, the fourth thickness d4 may be satisfactory to prevent or substantially prevent an extension of the intermediate layer MM to the first conductive layer ML1. For example, the fourth thickness d4 may be several hundreds A, for example, such as about 100 Å to about 1000 Å, but is not limited thereto.

The shielding layer SL may be disposed on the second conductive layer ML2. The shielding layer SL may be the uppermost layer of the conductive pattern G1. The shielding layer SL may include a material having a higher rigidity than that of the first conductive layer ML1. The shielding layer SL may protect the first conductive layer ML1 and/or the second conductive layer ML2 in dry etching processes. Accordingly, the shielding layer SL may include a material having a relatively higher anti-corrosiveness against a fluorine-based etching gas.

In addition, the shielding layer SL may have a lower light transmittance than that of the second conductive layer ML2. According to one or more embodiments of the present disclosure, when the conductive pattern G1 includes the shielding layer, the possibility of detecting a pseudo defect may be reduced in an optical inspection where the pseudo defect may be generated due to the surfaces of the layers ML1, ML2, BL, and MM disposed under the shielding layer SL being uneven. In other words, the shielding layer may improve the possibility of detecting the pseudo defect when the pseudo defect occurs. Accordingly, the detection process may be rapidly completed, and the reliability of the detection result may be improved.

The shielding layer SL may be provided with a suitable material, the transmittance of which changes through heat treatment (e.g., prescribed or predetermined heat treatment). For example, the shielding layer SL may include amorphous carbon. The amorphous carbon in an optically transparent state (e.g., soft-amorphous carbon) may be heat-treated to be in a transmittance-reduced state (e.g., hard-amorphous carbon). The hard-amorphous carbon has a high anti-corrosiveness against the fluorine-based gas to protect the first conductive layer ML1 in the dry etching process, which will be described in more detail below.

Referring to FIG. 6B, in the conductive pattern G1-1, the shielding layer SL may be omitted. Accordingly, the conductive pattern G1-1 may have a laminated structure of the first conductive layer ML1, the blocking layer BL, the intermediate layer MM, and the second conductive layer ML2. When the boundaries of the layers (e.g., ML1, ML2, MM, and BL) composing the conductive pattern G1-1 are relatively evenly provided, the pseudo defect may not be detected during an optical inspection. According to one or more embodiments of the present disclosure, the conductive pattern G1-1 includes four layers, and thus, may have a simpler layer structure than that of the conductive pattern G1 shown in FIG. 6A. Accordingly, the processes may be simplified, and costs may be reduced.

While FIGS. 6A and 6B illustrate some cross-sectional views of the gates (e.g., G1 and G1-1), the present disclosure is not limited thereto. According to an embodiment of the present disclosure, the signal lines connected to the third electrodes (e.g., G1 and G1-1) of the other transistors, for example, such as the gate lines or the connection lines connected thereto, may have the same or substantially the same laminate structure as those shown in FIGS. 6A and 6B. As another example, a conductive pattern or signal lines disposed at (e.g., in or on) the same layer as that of the third electrodes (e.g., G1 and G1-1) may also have the same or substantially the same laminate structure as those illustrated in FIGS. 6A and 6B. As another example, a conductive pattern or signal lines disposed at (e.g., in or on) a different layer from those of the third electrodes (e.g., G1 and G1-1) may also have the same or substantially the same laminate structure as those shown in FIGS. 6A and 6B.

Figure 7:
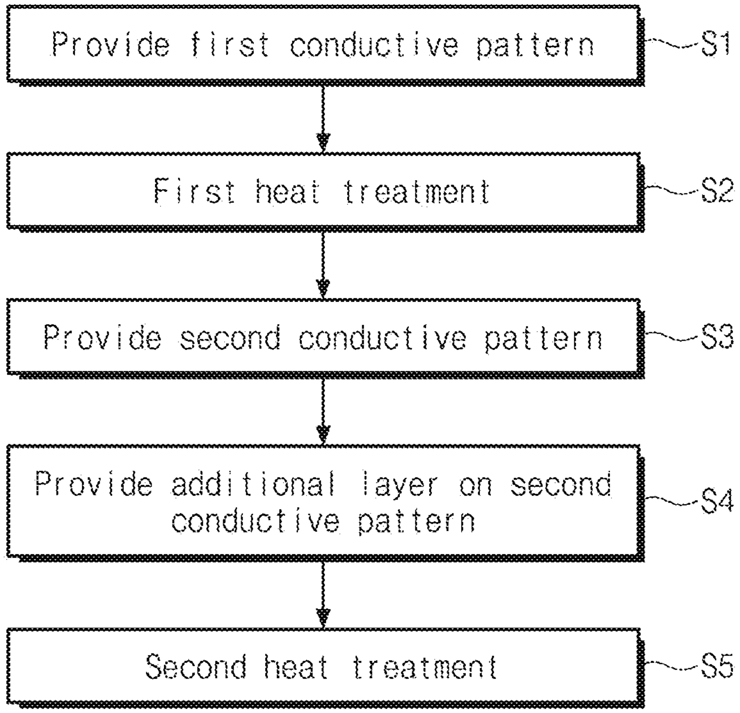
FIG. 7 is a flowchart illustrating a method of manufacturing a display panel according to an embodiment of the present disclosure.

FIG. 7 is a flowchart illustrating a method of manufacturing a display panel according to an embodiment of the present disclosure. FIGS. 8A through 8G are cross-sectional views showing a method of manufacturing a display panel according to an embodiment of the present disclosure. In FIGS. 7A through 8G, for convenience of illustration, an example method of manufacturing the conductive pattern corresponding to the gate G1 (e.g., see FIG. 5) of the first transistor T1 is shown.

Referring to FIG. 7, the display panel manufacturing method may start, and a first conductive pattern may be provided (e.g., block S1), a first heat treatment may be performed (e.g., block S2), a second conductive pattern may be provided (e.g., block S3), and a second heat treatment may be performed (e.g., block S5).

Figure 8A:
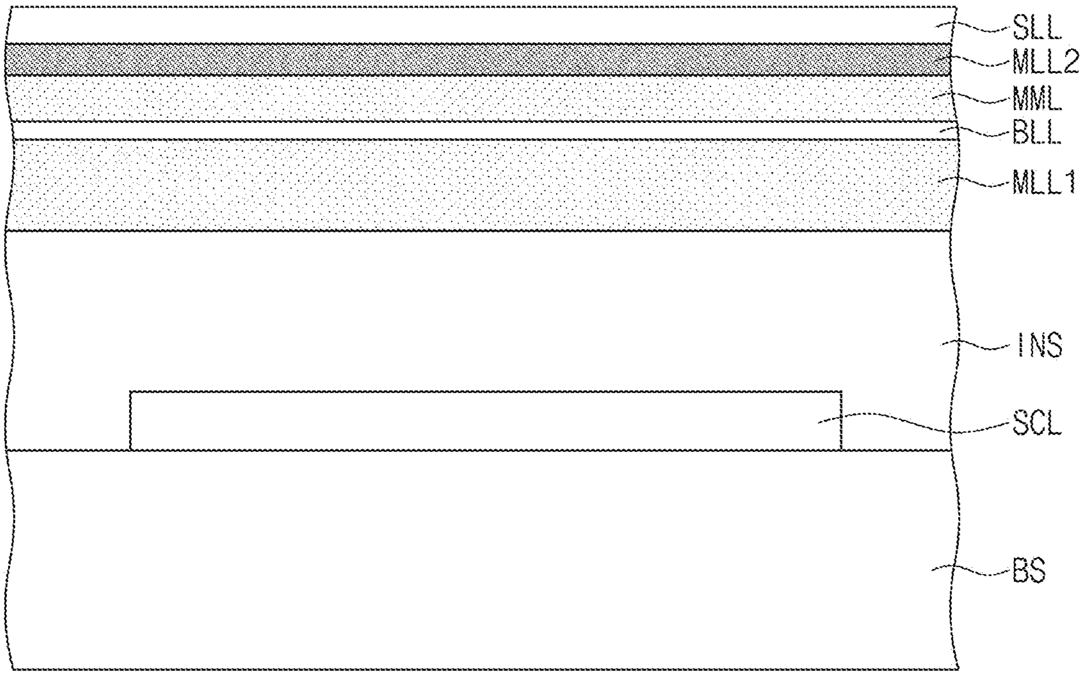
FIGS. 8A-8G are cross-sectional views showing a method of manufacturing a display panel according to an embodiment of the present disclosure.

Referring to FIGS. 7 and 8A, first to fifth layers MLL1, BLL, MML, MLL2, and SLL may be disposed (e.g., may be laminated) on the base substrate BS on which the semiconductor layer SCL and the insulation layer INS are provided. The base substrate BS may have the semiconductor layer SCL disposed thereon. For example, the base substrate BS may include the substrate 110, the barrier layer BRL, and the buffer layer BFL shown in FIG. 5, but is not limited thereto.

The semiconductor layer SCL is disposed on the base substrate BS. The semiconductor layer SCL may be provided by depositing and patterning a semiconductor material. The semiconductor layer SCL may include silicon. The semiconductor layer SCL may include amorphous silicon (a-Si). In the present embodiment, the semiconductor layer SCL may correspond to the semiconductor pattern of the first transistor T1 shown in FIG. 5, but is not limited thereto.

The insulation layer INS is disposed on the base substrate BS to cover the semiconductor layer SCL. The insulation layer INS may be provided by depositing or coating an insulation material. In the present embodiment, the insulation layer INS may correspond to the first insulation layer 10 shown in FIG. 5, but is not limited thereto.

The first layer MLL1 is disposed on the insulation layer INS. The first layer MLL1 may include a conductive material. The first layer MLL1 may include a low resistive material. For example, the first layer MLL1 may include a material having a low resistance of 0.5 ohm or lower, for example, such as aluminum, but the present disclosure is not limited thereto.

The second layer BLL is disposed on the first layer MLL1. The second layer BLL may have a smaller thickness than that of the first layer MLL1. The second layer BLL may include titanium nitride, but is not limited thereto.

The third layer MML is disposed on the second layer BLL. The third layer MML may include the same material as that of the first layer MLL1. For example, the third layer MML may include aluminum, but is not limited thereto.

Then, the fourth layer MLL2 is provided. The fourth layer MLL2 may be provided by contacting the third layer MML. The fourth layer MLL2 may be provided by depositing or coating a metal. The fourth layer MLL2 may include a material having a higher rigidity than that of the first layer MLL1. For example, the fourth layer MLL2 may include titanium, but is not limited thereto.

Then, the fifth layer SLL is provided on the fourth layer MLL2. In the present embodiment, the fifth layer SLL may be provided by depositing or coating a soft-amorphous carbon that has a light transmittance of about 90% or higher.

Figure 8B:
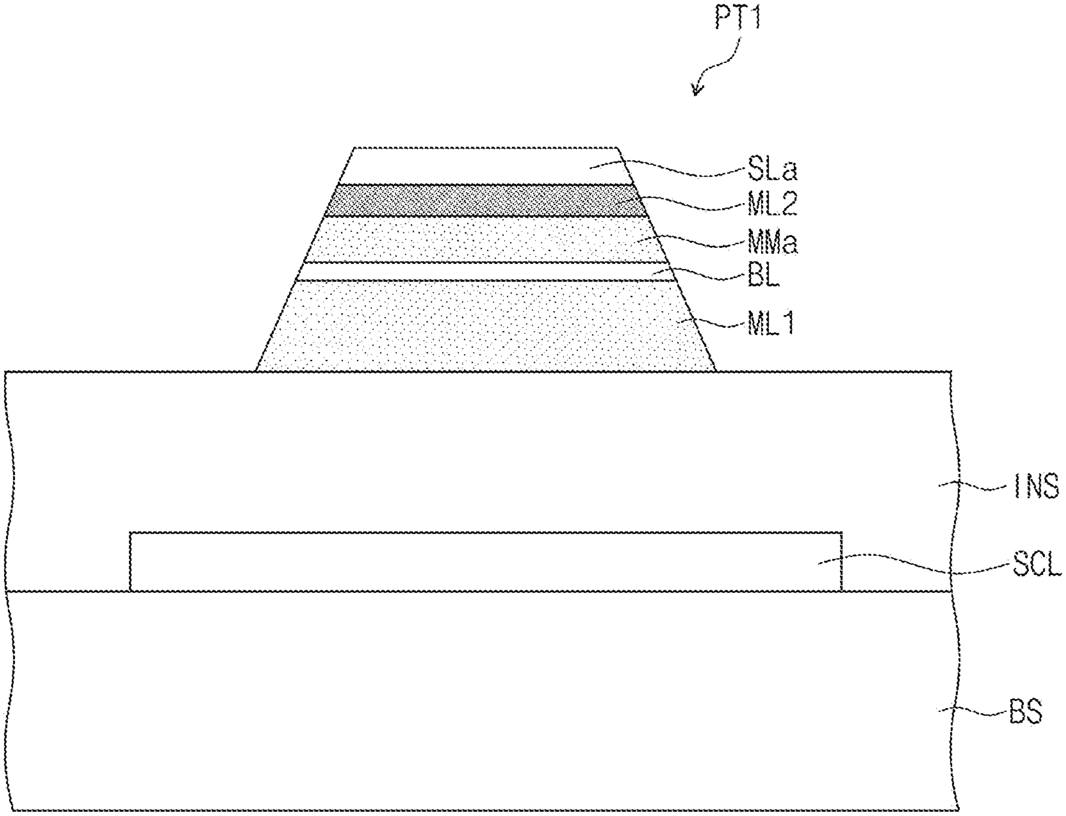

Referring to FIGS. 7 and 8B, the first to fifth layers MLL1, BLL, MML, MLL2, and SLL are patterned to provide a first pattern PT1. In the present embodiment, the first pattern PT1 may be provided by concurrently patterning the first to fifth layers MLL1, BLL, MML, MLL2, and SLL with each other through one mask. Accordingly, side surfaces of the patterned first layer ML1 (hereinafter, the first conductive layer), the patterned second layer BL (hereinafter, the blocking layer), the patterned second layer MMa (hereinafter, an untreated intermediate layer), the patterned fourth layer ML2 (hereinafter, the second conductive layer), and the patterned fifth layer SLa (hereinafter, an untreated shielding layer) may be arranged on a cross section (e.g., in a cross-sectional view). However, the present disclosure is not limited thereto. The side surface of the first pattern PT1 may be unevenly stepped, but is not limited to any particular embodiment.

Figure 8C:
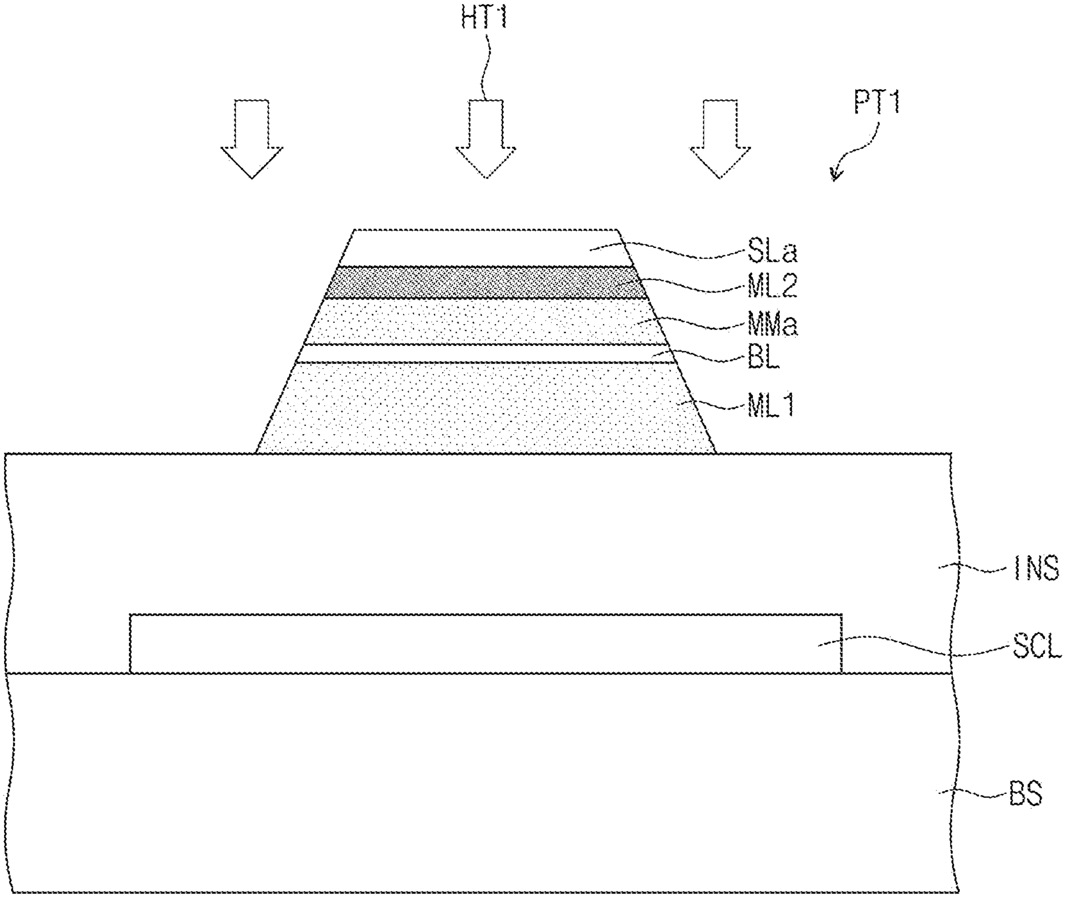
Figure 8D:
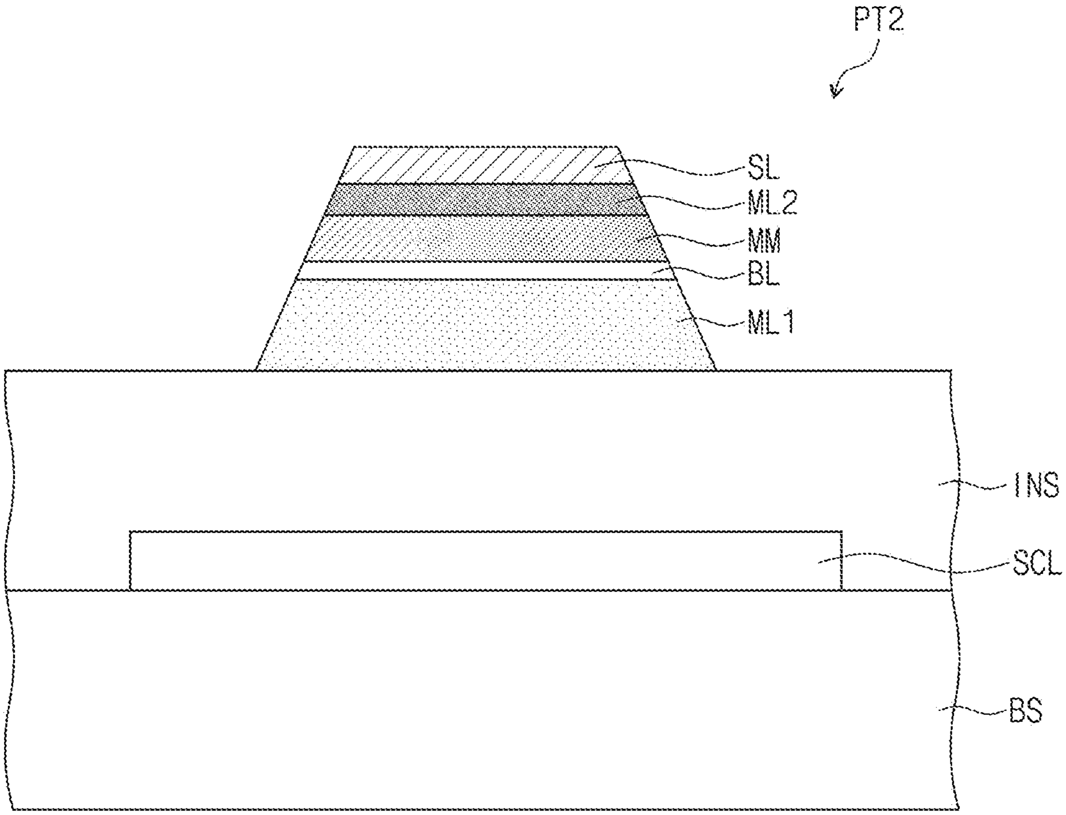

Referring to FIGS. 7, 8C, and 8D, the first pattern PT1 may become the second pattern PT2 through the first heat treatment HT1. FIG. 8C shows the first heat treatment (e.g., block S2), and FIG. 8D shows the second conductive pattern that is provided (e.g., block S3) for the second pattern PT2, which is a result of the first heat treatment HT1.

When the first heat treatment HT1 is applied to the first pattern PT1, the untreated intermediate layer MMa may change to the intermediate layer MM. The untreated intermediate layer MMa may have the same material as that of the first conductive layer ML1, and may be provided in the same or substantially the same manner to be in the same or substantially same state as that of the first conductive layer ML1. In other words, the intermediate layer MM may be the result of the untreated intermediate layer MMa that is changed by the first heat treatment HT1.

When the first heat treatment HT1 is performed, a portion of the second conductive layer ML2 may diffuse to the untreated intermediated layer MMa. Accordingly, an alloy of the metal constituting the second conductive layer ML2 and a metal constituting the untreated intermediate layer MMa may be provided. Accordingly, the intermediate layer MM includes the alloy.

When the untreated intermediate layer MMa includes aluminum, and the second conductive layer ML2 includes titanium, diffusion coefficients of the titanium for aluminum may exponentially increase over temperature. In other words, a diffusion speed of the second conductive layer ML2 for the untreated intermediate layer MMa may increase, as the temperature for the first heat treatment HT1 becomes higher. In the present embodiment, the first heat treatment HT1 may continue for 30 minutes at about 460 degrees, but the present disclosure is not limited thereto.

The diffusion of the second conductive layer ML2 through the untreated intermediate layer MMa may be blocked by the blocking layer BL. The blocking layer BL blocks the diffusion of the second conductive layer ML2 from extending to the first conductive layer ML1. The first conductive layer ML1 having the same material as that of the untreated intermediate layer MMa may not be influenced by the second conductive layer ML2 due to the blocking layer BL, even when the first heat treatment HT1 is performed. Accordingly, the first conductive layer ML1 may be stably heat-treated in the first heat treatment HT1.

According to one or more embodiments of the present disclosure, because the diffusion of the second conductive layer ML2 through the untreated intermediate layer MMa is blocked by the blocking layer BL, an area in which the intermediate layer MM is provided may be easily controlled through the position of the blocking layer BL. In addition, because the rear surface of the untreated intermediate layer MMa is the top surface of the blocking layer BL, the boundary of the diffusion area may be evenly set by the blocking layer BL in the cross section (e.g., in a cross-sectional view).

When the first heat treatment HT1 is performed, the untreated shielding layer SLL may change to the shielding layer SL. As described above, the untreated shielding layer SLL may include a suitable material such as a soft-amorphous carbon, and the transmittance of the material may change according to the first heat treatment HT1.

The soft-amorphous carbon has a light transmittance of about 90% with respect to light of about 550 nm. When heat-treated, the soft-amorphous carbon may change to a state where the light transmittance is reduced, such as a state of a hard-amorphous carbon, due to an increase of SP2 fractions. In other words, the untreated shielding layer SLL may include the soft-amorphous carbon, and the resulting shielding layer SL may include the hard-amorphous carbon.

Figure 8E:
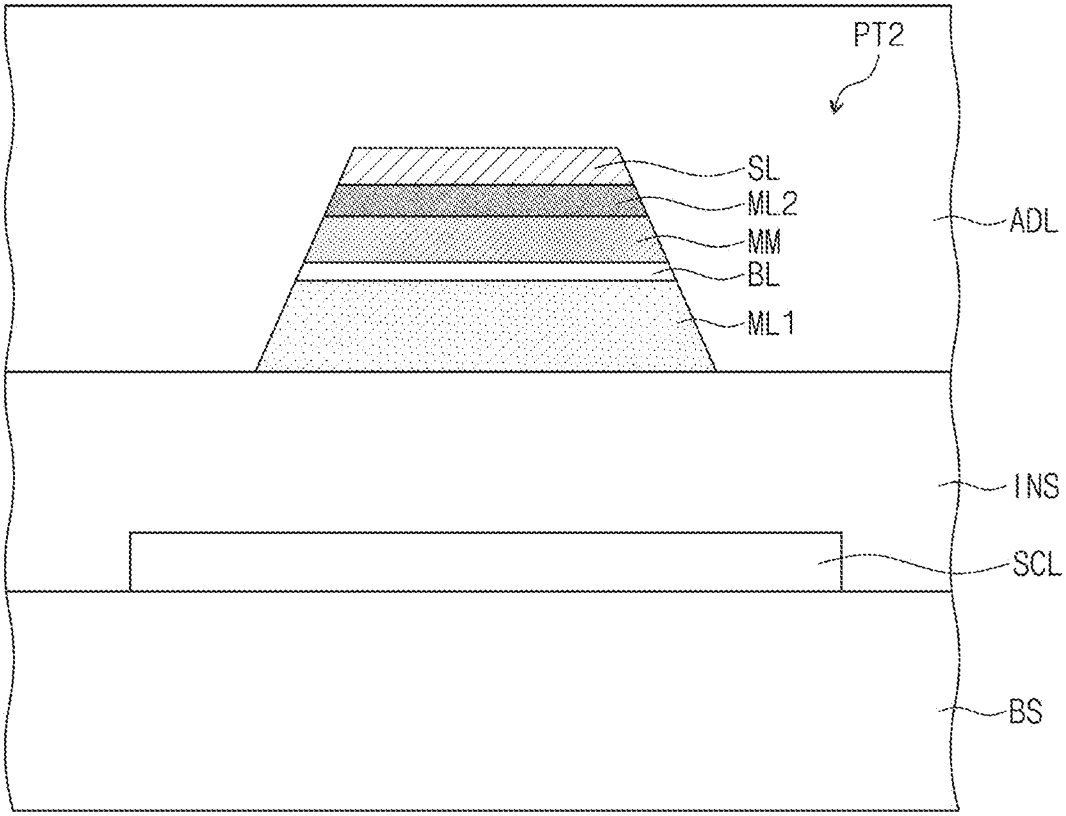

Referring to FIGS. 7 and 8E, the additional layer ADL may be disposed on the second pattern PT2. The additional layer ADL may be disposed on the insulation layer INS to cover the second pattern PT2. The additional layer ADL may be a layer disposed on the second pattern PT2, and may include, for example, the second and third insulation layers 20 and 30 shown in FIG. 5, but the present disclosure is not limited thereto.

Figure 8F:
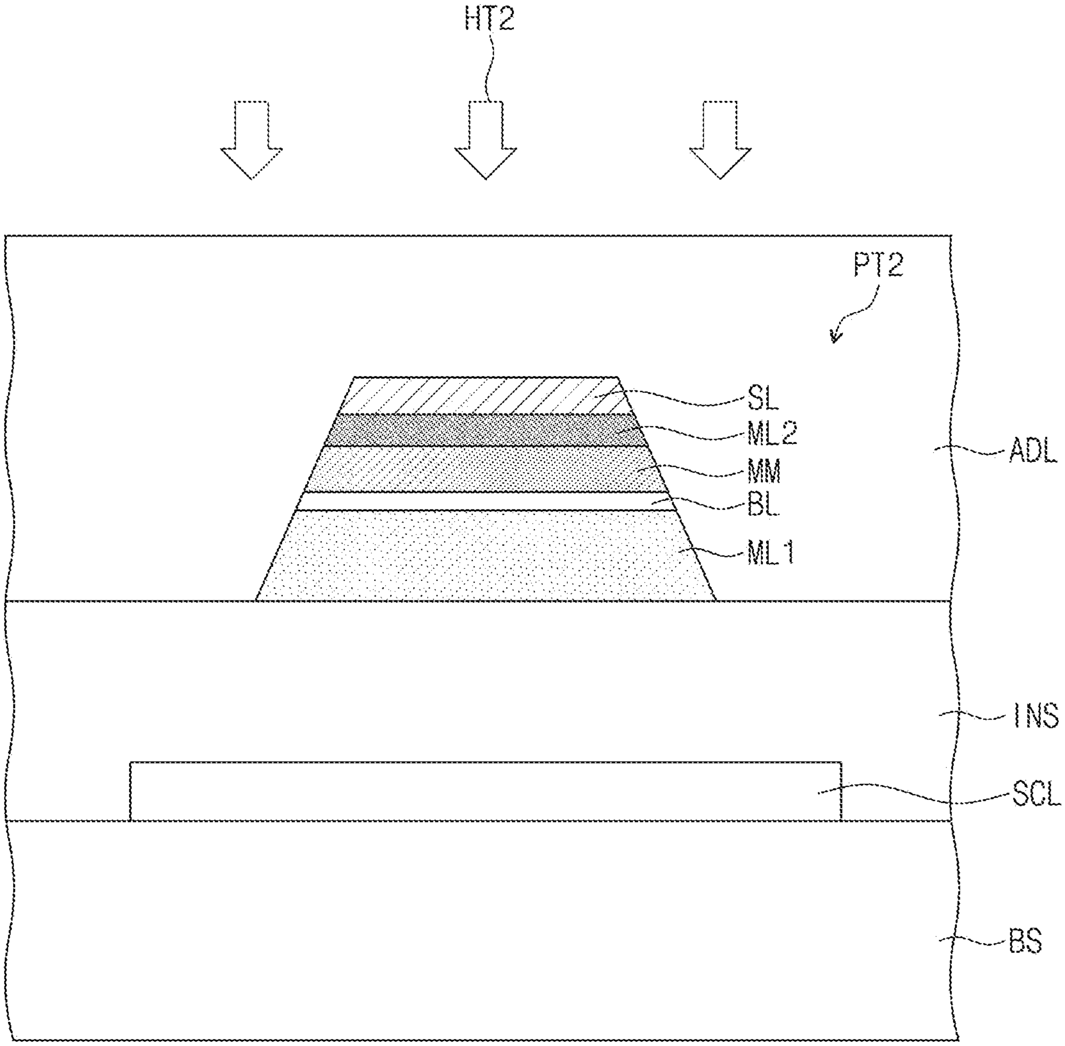
Figure 8G:
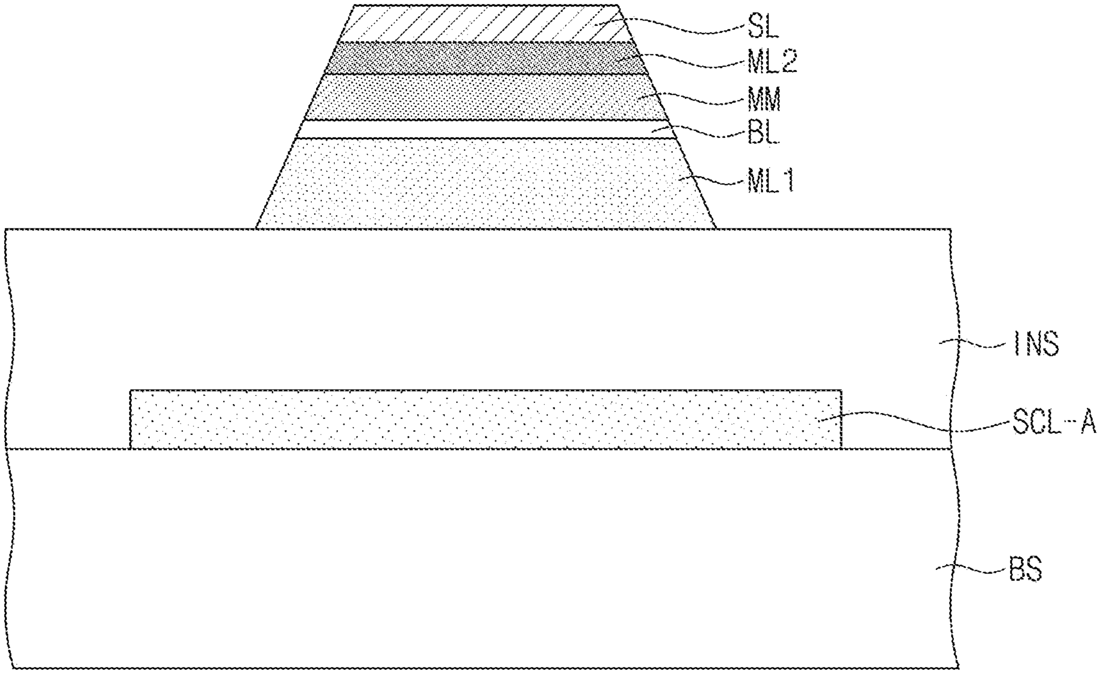

Referring to FIGS. 7, 8F, and 8G, a heat-treated semiconductor layer SCL-A may be provided through the second heat treatment HT2 (e.g., block S5). The second heat-treatment HT2 may be performed in an annealing process or an activation process. The semiconductor layer SCL including amorphous silicon is re-crystallized by the second heat-treatment HT2 to become the heat-treated semiconductor layer SCL-A including low-temperature polycrystalline silicon (low-temperature polysilicon or LTPS). In addition, the distribution of dopants doped in the semiconductor layer SCL-A may become uniform or substantially uniform due to the second heat treatment HT2.

The second pattern PT2 according to one or more embodiments of the present disclosure may include the intermediate layer MM contacting the second conductive layer ML2. The stress between the intermediate layer MM and the second conductive layer ML2 may decrease in comparison to the stress between the untreated intermediated layer MMa and the second conductive layer ML2. As the untreated intermediate layer MMa changes to the intermediate layer MM, the stress with the second conductive layer ML2 may decrease. When a line stress is high, a thermal void may be generated by the heat treatment. In an embodiment, the second pattern PT2 may include the intermediate layer MM, and thus, the void may not be generated during the second heat treatment HT2. Accordingly, a fault such as a cut line of the second pattern PT2, or a cut line of the additional layer ALD, may be prevented or substantially prevented from occurring.

In addition, in the second pattern PT2 according to one or more embodiments of the present disclosure, an area in which the second semiconductor layer ML2 diffuses may be easily controlled by including the blocking layer BL. Accordingly, the intermediate layer MM having a relatively high resistance may be prevented or substantially prevented from widely diffusing, and thus, the intermediate layer MM may be easily and stably controlled. In addition, the thickness of the intermediate layer MM may be uniformly or substantially uniformly controlled through the blocking layer BL. Accordingly, the second pattern PT2 may have a uniform or substantially uniform resistance.

In addition, the second pattern PT2 according to one or more embodiments of the present disclosure may include the shielding layer SL. As described above, the light transmittance of the shielding layer SL may be degraded. Accordingly, results of an optical inspection performed on the layers disposed under the shielding layer SL may not be influenced by the shielding layer SL.

Figure 9A:
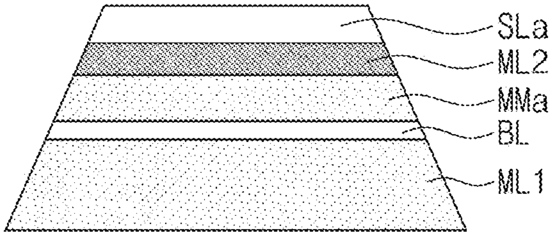
FIGS. 9A and 9B are cross-sectional views of conductive patterns according to an embodiment of the present disclosure.
Figure 9B:
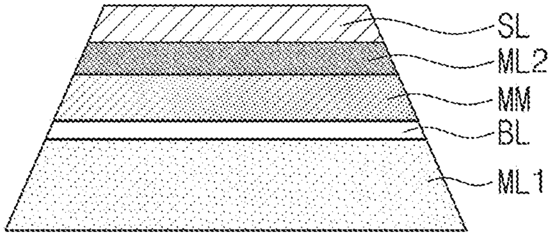
Figure 10A:
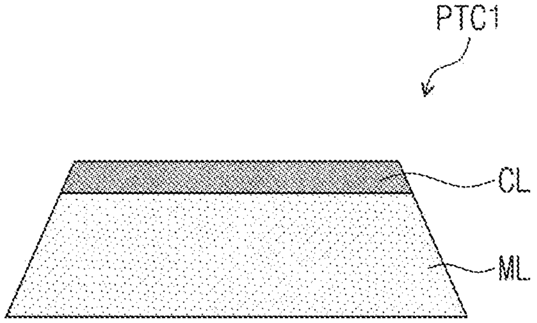
FIGS. 10A and 10B are cross-sectional views of conductive patterns according to a comparative example.
Figure 10B:
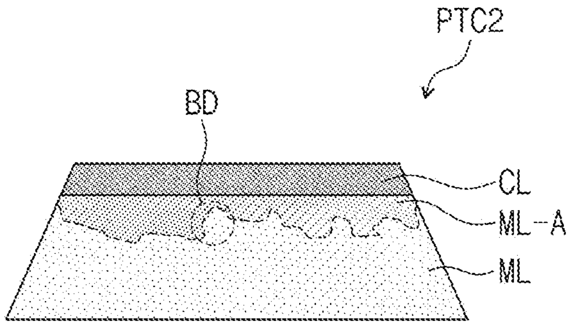
Figure 11:
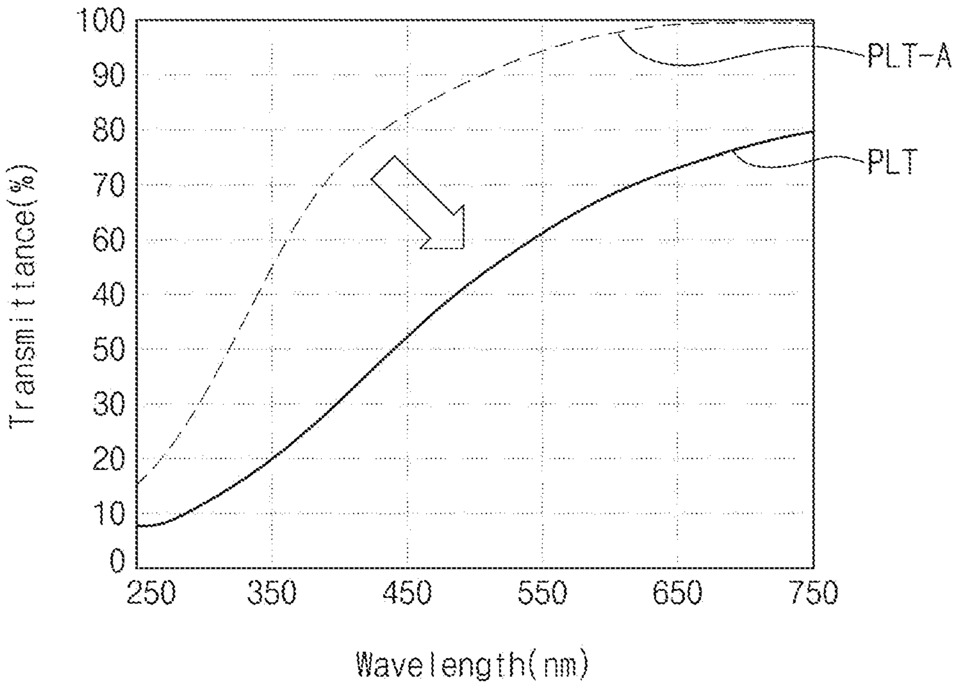
FIG. 11 is a graph illustrating light transmittance according to wavelength.

FIGS. 9A and 9B are cross-sectional views of conductive patterns according to an embodiment of the present disclosure. FIGS. 10A and 10B are cross-sectional views of conductive patterns according to a comparative example. FIG. 11 is a graph illustrating light transmittance according to wavelength.

FIG. 9A shows the first pattern PT1, and FIG. 9B shows the second pattern PT2. FIG. 10A shows a conductive pattern PTC1 (hereinafter, a first comparison pattern) according to a comparative example, and FIG. 10B shows a heat-treated first comparison pattern PTC2 (hereinafter, a second comparison pattern). In other words, the first pattern PT1 and the first comparison pattern PTC1 may be the non-heat treated patterns, and the second pattern PT2 and the second comparison pattern PTC2 may be the heat-treated patterns.

Referring to FIGS. 9A and 10A, the first comparison pattern PTC1 includes a first metal layer ML and a second metal layer CL. The first metal layer ML may correspond to the first layer MLL1 and the untreated intermediate layer MMa of the first pattern PT1. The second metal layer CL may correspond to the fourth layer MLL2 of the first pattern PT1.

The first pattern PT1 may further include the blocking layer BL and the untreated shielding layer SLa, in comparison to the first comparison pattern PTC1. The first pattern PT1 may have a structure in which the blocking layer BL is further inserted into a portion of the thickness of the first metal layer ML of the first comparison pattern PTC1, and the untreated shielding layer SLa on the second metal layer CL of the first comparison pattern PTC1 to cover the second metal layer CL.

Referring to FIGS. 9B and 10B, the second comparison pattern PTC2 may further include an alloy layer ML-A, in addition to the first comparison pattern PTC1. The alloy layer ML-A may be provided in a way that the second metal layer CL of the first comparison pattern PTC1 diffuses to the first metal layer ML by heat treatment. The alloy layer ML-A may correspond to the intermediate layer MM of the second pattern PT2.

In the second comparison pattern PTC2, the alloy layer ML-A is provided through the heat treatment, and accordingly, the line stress, which may be generated between the first metal layer ML and the second metal layer CL, may be reduced. When the line stress is high, a thermal void may be generated during the heat treatment, such as the activation process, and such a void may induce a fault, such as a cut line of the conductive pattern. The alloy layer ML-A of the second comparison pattern PTC2 may reduce such a thermal defect to improve the process reliability.

However, in the second comparison pattern PTC2, the boundary BD between the alloy layer ML-A and the first metal layer ML may not be even in the cross section (e.g., in a cross-sectional view). Because the alloy layer ML-A is provided while the second metal layer CL gradually diffuses from a top side of the first metal layer ML, it may be difficult to control the evenness in the cross section. The unevenness boundary BD may be detected as a defect during a later optical inspection. Such a pseudo defect may make it difficult to detect an actual defect, and be apt to lower the reliability of the optical inspection.

Referring to FIG. 9B, the intermediate layer MM of the second pattern PT2 may be formed in a way that the second conductive layer ML2 diffuses to a depth where the blocking layer BL is located. The bottom surface of the intermediate layer MM may correspond to the top surface of the blocking layer BL, and thus, may be evenly controlled in the cross section (e.g., in a cross-sectional view). Accordingly, the number of pseudo defects, which may be generated at a later optical inspection, may be reduced.

FIG. 11 shows a light transmittance graph PLT-A of the untreated shielding layer SLa, and a light transmittance graph PLT of the shielding layer SL. As shown in FIG. 11, the light transmittance of the untreated shielding layer SLa may be lowered through heat treatment. In the second pattern PT2 including the shielding layer SL, an uneven interface may be prevented or substantially prevented from being visually detected due to the low light transmittance, even when the bottom surface of the intermediate layer MM is spaced apart upwards from the blocking layer BL due to low diffusion. Accordingly, the number of pseudo defects, which may be generated at a later optical inspection, may be reduced.

In addition, by further including the shielding layer SL, the second pattern PT2 may stably protect the first conductive layer ML1 from an etching gas during dry etching processes for providing a contact hole later.

According to one or more embodiments of the present disclosure, the resistance of the lines may be reduced to improve the display characteristics of the display panel, and thus, a display panel having high resolution may be provided. Further, according to one or more embodiments of the present disclosure, power consumption of the display panel may also be reduced.

In addition, according to one or more embodiments of the present disclosure, a defect in the signal lines may be reduced to enhance the process reliability of the display panel.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display panel comprising:

a base substrate;

a light emitting element on the base substrate;

a transistor between the base substrate and the light emitting element, and connected with the light emitting element; and a conductive pattern between the base substrate and the light emitting element, wherein the conductive pattern comprises:

a first conductive layer comprising a first material;

a second conductive layer on the first conductive layer in a stacking direction, and comprising a second material different from the first material;

a blocking layer between the first conductive layer and the second conductive layer, and comprising a third material different from the first material; and an intermediate layer between the first conductive layer and the second conductive layer which have different materials from each other, and contacting the blocking layer and the second conductive layer, wherein the intermediate layer comprises an alloy of the first material and the second material, and wherein the first conductive layer is spaced from the intermediate layer with the blocking layer in between.

2. The display panel according to claim 1, wherein the first material has a lower resistance than that of the second material.

3. The display panel according to claim 2, wherein the third material comprises a nitride of the second material.

4. The display panel according to claim 3, wherein the second material comprises titanium.

5. The display panel according to claim 4, wherein the first material comprises aluminum.

6. The display panel according to claim 1, wherein the intermediate layer contacts the blocking layer.

7. The display panel according to claim 6, wherein the intermediate layer has a smaller thickness in the stacking direction than that of the first conductive layer.

8. The display panel according to claim 1, further comprising a shielding layer on the second conductive layer.

9. The display panel according to claim 8, wherein the shielding layer has a lower light transmittance than that of the second conductive layer.

10. The display panel according to claim 9, wherein the shielding layer comprises amorphous carbon.

11. The display panel according to claim 1, wherein the transistor comprises low-temperature polysilicon-silicon.

12. The display panel according to claim 11, wherein the conductive pattern is a gate of the transistor, or a signal line located at a same layer as that of the gate.

13. A display panel manufacturing method comprising:

providing a semiconductor pattern comprising amorphous silicon;

providing a first conductive pattern comprising a first layer, a second layer, a third layer, and a fourth layer that are sequentially stacked;

performing a first heat treatment;

providing an additional layer on the first conductive pattern; and performing a second heat treatment for crystallizing the semiconductor pattern, wherein, in the performing of the first heat treatment, the fourth layer diffuses into the third layer to form an intermediate layer, and wherein the intermediate layer comprises an alloy of a material of the fourth layer and a material of the third layer.

14. The display panel manufacturing method according to claim 13, wherein the performing of the first heat treatment continues at a temperature of 600 degrees or lower.

15. The display panel manufacturing method according to claim 13, wherein the intermediate layer comprises an alloy of aluminum and titanium.

16. The display panel manufacturing method according to claim 15, wherein the second layer comprises titanium nitride.

17. The display panel manufacturing method according to claim 13, wherein the performing of the second heat treatment continues at a temperature of 600 degrees or lower.

18. The display panel manufacturing method according to claim 13, wherein the first conductive pattern further comprises a fifth layer on the fourth layer, and wherein the fifth layer has a higher light transmittance than that of the fourth layer.

19. The display panel manufacturing method according to claim 18, wherein the fifth layer has a lower light transmittance than that of the fourth layer after the performing of the first heat treatment.

20. The display panel manufacturing method according to claim 19, wherein the fifth layer comprises amorphous carbon.

21. The display panel manufacturing method according to claim 13, further comprising forming at least one contact hole in the additional layer by an etching gas, wherein the etching gas comprises fluorine.

* * * * *